(12) United States Patent
Yano et al.

(10) Patent No.: US 8,850,107 B2
(45) Date of Patent: *Sep. 30, 2014

(54) MEMORY SYSTEM STORING MANAGEMENT INFORMATION AND METHOD OF CONTROLLING SAME

(71) Applicant: Kabushiki Kaisha Toshiba, Minato-ku (JP)

(72) Inventors: Junji Yano, Kanagawa (JP); Hidenori Matsuzaki, Tokyo (JP); Kosuke Hatsuda, Tokyo (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/859,528

(22) Filed: Apr. 9, 2013

(65) Prior Publication Data

US 2013/0227208 A1 Aug. 29, 2013

Related U.S. Application Data

(63) Continuation of application No. 12/529,145, filed as application No. PCT/JP2009/052599 on Feb. 10, 2009, now Pat. No. 8,443,133.

(30) Foreign Application Priority Data

Feb. 29, 2008 (JP) ................................. 2008-051340
Mar. 1, 2008 (JP) ................................. 2008-051452

(51) Int. Cl.
*G06F 12/02* (2006.01)
*G11C 16/04* (2006.01)
*G11C 7/20* (2006.01)
*G11C 16/10* (2006.01)
*G11C 11/56* (2006.01)
*G06F 11/14* (2006.01)

(52) U.S. Cl.
CPC ........ *G06F 12/0246* (2013.01); *G11C 16/0483* (2013.01); *G11C 7/20* (2013.01); *G11C 16/10* (2013.01); *G11C 11/5628* (2013.01); *G11C 16/105* (2013.01); *G06F 11/1471* (2013.01)
USPC ................... 711/103; 711/162; 711/E12.001; 711/E12.008; 711/E12.103

(58) Field of Classification Search
USPC .................. 711/103, 162, E12.001, E12.008, 711/E12.103
See application file for complete search history.

(56) References Cited

U.S. PATENT DOCUMENTS

| | | | |
|---|---|---|---|
| 6,591,329 | B1 | 7/2003 | Kakinuma et al. |
| 7,814,057 | B2 | 10/2010 | Kathuria et al. |
| 2004/0267835 | A1 | 12/2004 | Zwilling et al. |
| 2006/0224636 | A1 | 10/2006 | Kathuria et al. |

FOREIGN PATENT DOCUMENTS

| | | |
|---|---|---|
| JP | 2001-249852 A | 9/2001 |
| JP | 2004-192789 | 7/2004 |
| JP | 2005-242897 | 9/2005 |
| JP | 2007-179347 | 7/2007 |
| WO | 99 32977 | 7/1999 |

OTHER PUBLICATIONS

Office Action issued on May 17, 2013 in the corresponding Taiwanese Patent Application No. 098106248 (with English Translation).
Japanese Office Action issued May 8, 2012, in Japanese Patent Application No. 2008-051452 (with English Translation).
Office Action issued Aug. 7, 2012, in Japanese Patent Application No. 2008-051452 (with English Translation).
Japanese Office Action mailed Nov. 27, 2012, in Japanese Patent Application No. 2008-051452 filed on Mar. 1, 2008 (with English Translation).
Decision of Dismissal of Amendment mailed on Nov. 27, 2012, in Japanese Patent Application No. 2008-051452 filed on Mar. 1, 2008 (with English Translation).

*Primary Examiner* — Jasmine Song

(74) *Attorney, Agent, or Firm* — Oblon, Spivak, McClelland, Maier & Neustadt, L.L.P.

(57) ABSTRACT

A memory system includes a management-information restoring unit. The management-information restoring unit determines whether a short break has occurred referring to a pre-log or a post-log in a NAND memory. The management-information restoring unit determines that a short break has occurred when the pre-log or the post-log is present in the NAND memory. In that case, the management-information restoring unit determines timing of occurrence of the short break, and, after selecting a pre-log or a post-log used for restoration, performs restoration of the management information reflecting these logs on a snapshot. Thereafter, the management-information restoring unit applies recovery processing to all write-once blocks in the NAND memory, takes the snapshot again, and opens the snapshot and the logs in the past.

19 Claims, 17 Drawing Sheets

AFTER LOWER ORDER PAGE WRITING AND BEFORE HIGHER ORDER PAGE WRITING

BEFORE HIGHER ORDER PAGE WRITING AND AFTER ADJACENT CELL WRITING

AFTER HIGHER ORDER PAGE WRITING

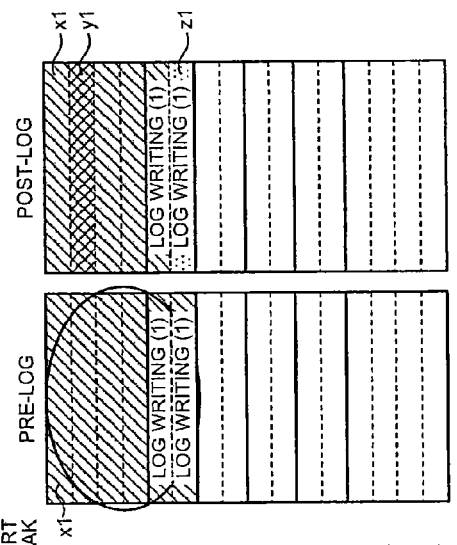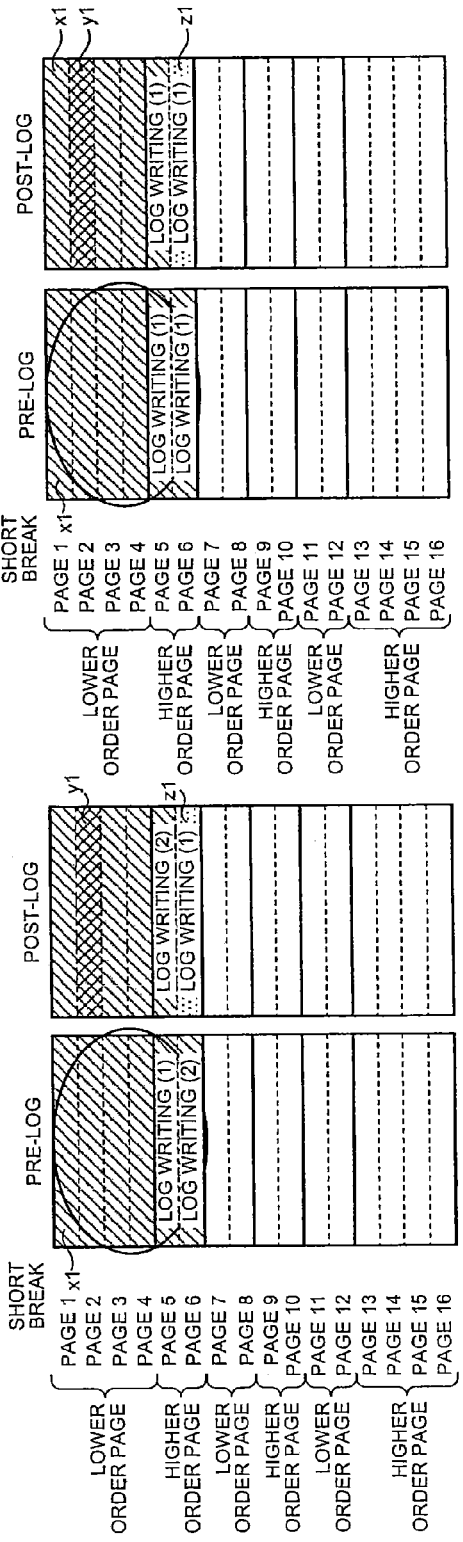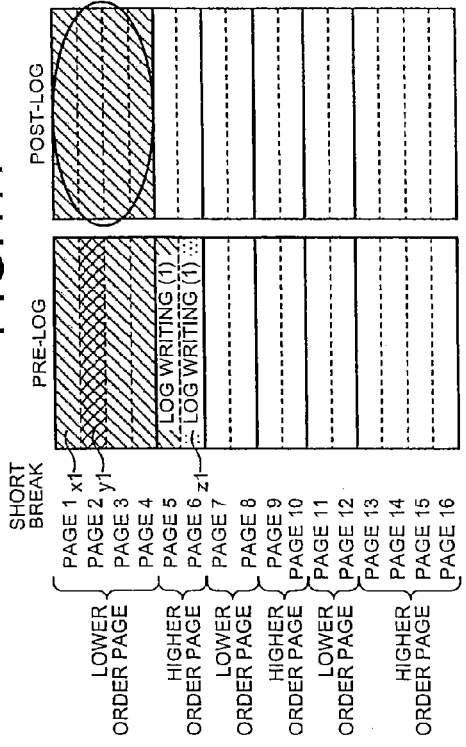

US 8,850,107 B2

MEMORY SYSTEM STORING MANAGEMENT INFORMATION AND METHOD OF CONTROLLING SAME

CROSS-REFERENCE TO RELATED APPLICATIONS

The present application is a continuation of U.S. application Ser. No. 12/529,145 filed on Sep. 21, 2009, and is based on PCT/JP2009/052599 filed Feb. 10, 2009, and claims priority to JP 2008-051452 filed Mar. 1, 2008 and JP 2008-051340 filed Feb. 29, 2008, the entire contents of each of which are hereby incorporated by reference.

TECHNICAL FIELD

The present invention relates to a memory system employing a nonvolatile semiconductor storage device.

BACKGROUND ART

Some personal computers (PC) employ a hard disk device as a secondary storage device. In such PCs, a technology is known for backing up data that has been stored in the hard disk device to prevent the data from becoming invalid because of some failure. For example, when act of changing data in the hard disk device is detected, a snapshot as a backup copy of the data before the change is taken and a log of changes made to the data is generated. Then, processing for taking a new snapshot, invalidating a log taken in the past before the new snapshot was taken, and generating a new log is repeated at every predetermined time (see, for example, US Patent Application Publication No. 2006/0224636). In case data becomes invalid due to some reason, the data can be restored by referring to the snapshot and the log.

In recent years, a capacity of a NAND flash memory as a nonvolatile semiconductor storage device has been increased dramatically. As a result, PCs including a memory system having the NAND flash memory as a secondary storage device have been put to practical use. However, the technology disclosed in US Patent Application Publication No. 2006/0224636 cannot be applied to backup of data stored in such a personal computer having the NAND flash memory as the secondary storage device as in the case of backup of data stored in the personal computer having the hard disk device as the secondary storage device. This is because a multi-value memory technology that can store a plurality of data (multi-value data) equal to or larger than 2 bits in one memory cell is employed to increase the capacity of the NAND flash memory.

A memory cell configuring a multi-value memory has a field effect transistor structure having a stacked gate structure in which a gate insulating film, a floating gate electrode, an inter-gate insulating film, and a control gate electrode are stacked in order on a channel region and a plurality of threshold voltages can be set according to the number of electrons accumulated in the floating gate electrode. In order to make it possible to perform multi-value storage based on the plurality of threshold voltages, the distribution of a threshold voltage corresponding to one data needs to be made extremely narrow.

For example, as a multi-value memory that can store four values, there is a multi-value memory that includes a lower order page and a higher order page in one memory cell and stores 2 bits (four values) by writing 1-bit data in the respective pages. In a method of writing data in such a multi-value memory, after data is written in a lower order page of a first memory cell, data is written in a lower order page of a memory cell (a second memory cell) that is adjacent to the first memory cell. After data is written in this adjacent memory cell, data is written in a higher order page of the first memory cell (see, for example, JP-A 2004-192789 (KOKAI)).

However, in such a multi-value memory, a threshold voltage of the first memory cell in which data has been written earlier fluctuates because of a threshold voltage of the second memory cell in which the data is written later and that is adjacent to the first memory cell. Therefore, in the multi-value memory, it is likely that lower order page breakage occurs in which, if writing is suspended because of, for example, abnormal isolation of a power supply while data is being written in a higher order page of a certain memory cell, data in a lower order page in which the data is written earlier is also broken.

Therefore, in the personal computer employing the NAND flash memory, for example, when the memory system is reset from the abnormal isolation of the power supply or the like, it is necessary to reset the memory system to a state before the abnormal isolation occurs by distinguishing timing of the suspension or, when the wiring is suspended during writing of a log, distinguishing presence or absence of log breakage and selecting a log not affected by the suspension and reflecting the log on a snapshot. However, even if such restoration processing is performed, the broken log is still present. Therefore, there is a problem in that likelihood that the broken log is read by mistake after the resetting cannot be eliminated and reliability of the memory system is not secured.

In the memory system having the NAND flash memory, when data is stored, it is necessary to once erase a writing area, for example, in a unit called block and thereafter perform writing in a unit called page. On the other hand, when data is stored, it is necessary to once erase a writing area in, for example, a unit called block and then perform writing in a unit called page. On the other hand, there is a problem in that, as the number of times of erasing for a block performed prior to such writing of the data, deterioration in a memory cell configuring the block worsens. In other words, there is a limit in the rewritable number of times of respective blocks. Therefore, suppression of the number of times of erasing of the blocks is indispensable for an extension of the durable life of the memory system. As one of measures against such a problem, for example, processing called wear leveling for dispersing update portions of data as equally as possible is performed such that the numbers of times of erasing of all the blocks in the memory system are substantially equal.

When a signal for standby, sleep, or reset is generated in the personal computer or the like, in the conventional method for storing the snapshot and the log, the snapshot is taken before the memory system shifts to a designated state. For example, when the standby signal is received, management information concerning the memory system is stored by taking the snapshot again. Subsequently, the memory system shifts to a standby state. After the memory system is reset from the standby state, the management information is restored by using the stored snapshot. The memory system is restored to a state before the shift to the standby state based on this management information.

When the method of taking the snapshot again every time the standby signal or the like is received is applied the memory system having the NAND flash memory, there is a problem in that the durable life of the memory system is reduced according to an increase in the number of times of acquisition of the snapshot. This is because, in acquiring the snapshot, since a block as a storage area for management information is erased first and then the management information is written in the block, the memory cell is deteriorated by the erasing of the block. When the memory cell shifts to the standby state after the standby signal or the like is received and the snapshot is taken again, since it takes time to create the snapshot, there is a problem in that waiting time until the shift to the standby state or the like is long.

DISCLOSURE OF INVENTION

According to an aspect of the present invention, there is provided a memory system including a volatile first storing unit; a nonvolatile second storing unit including a memory cell that can store multi-value data; and a controller that performs data transfer between a host apparatus and the second storing unit via the first storing unit, stores management information including a storage position of the data stored in the second storing unit during a startup operation of the memory system into the first storing unit, and performs, while updating stored management information, data management in the first and second storing units based on the stored management information. The controller includes a management-information storing unit that stores, when a predetermined condition is satisfied, the management information stored in the first storing unit in the second storing unit as a snapshot and stores a log as update difference information of the management information in the second storing unit; and a management-information restoring unit that takes, when the log is present in the second storing unit when starting the startup operation, the snapshot again and stores the snapshot in the second storing unit after performing restoration of the management information in the first storing unit based on the snapshot and the log.

According to another aspect of the present invention, there is provided a memory system including a volatile first storing unit; a nonvolatile second storing unit including a memory cell that can store multi-value data; and a controller that performs data transfer between a host apparatus and the second storing unit via the first storing unit, stores management information including a storage position of the data stored in the second storing unit during a startup operation of the memory system into the first storing unit, and performs, while updating stored management information, data management in the first and second storing units based on the stored management information. The controller includes a management-information storing unit that stores, when a predetermined condition is satisfied, the management information stored in the first storing unit in the second storing unit as a snapshot and stores a log as update difference information of the management information in the second storing unit; and a management-information restoring unit that performs, when the log is present in the second storing unit when starting the startup operation, restoration of the management information in the first storing unit based on the snapshot and the log and performs, when the log is not present in the second storing unit when starting the startup operation, restoration of the management information in the first storing unit based on the snapshot. The management-information storing unit determines, when a signal from among a standby signal, a sleep signal, and a reset signal is received, whether the snapshot should be taken again before shifting to a designated state designated by the signal.

BRIEF DESCRIPTION OF DRAWINGS

FIGS. 17E to 17G are diagrams (2) for explaining the selection method for logs used for restoration of management information;

BEST MODE(S) FOR CARRYING OUT THE INVENTION

Exemplary embodiments of memory systems according to the present invention are explained in detail below with reference to the accompanying drawings. The present invention is not limited by this embodiment.

First Embodiment

Figure 1:
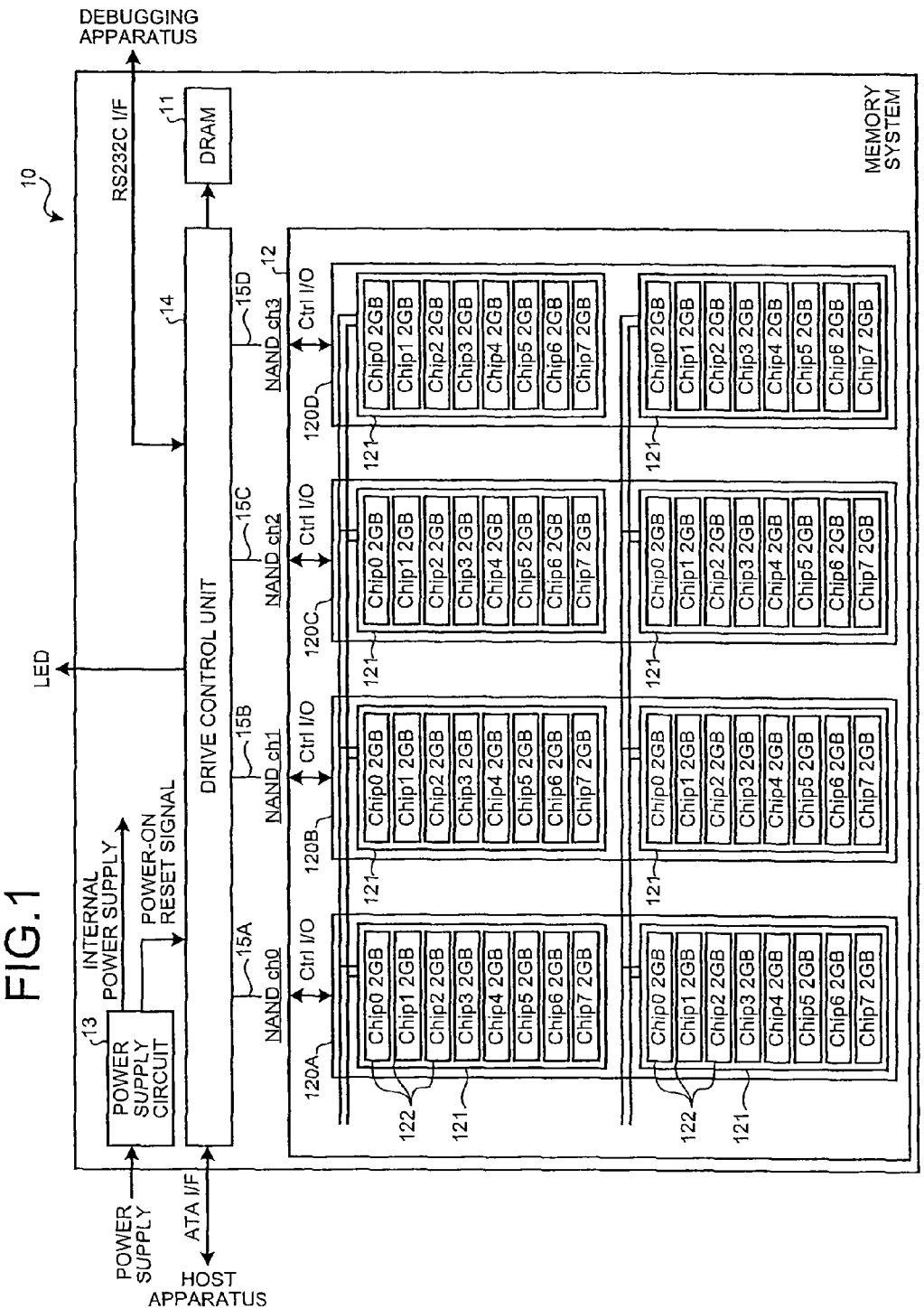
FIG. 1 is a block diagram of an example of a configuration of a memory system according to an embodiment of the present invention.

A memory system according to a first embodiment of the present invention includes a nonvolatile semiconductor storage device and is used as a secondary storage device (SSD: Solid State Drive) of a host apparatus such as a personal computer. The memory system has a function of storing data requested by a host apparatus to be written and reading out data requested by the host apparatus to be read out and outputting the data to the host apparatus. FIG. 1 is a block diagram of an example of a configuration of a memory system 10 according to the first embodiment of the present invention. This memory system 10 includes a DRAM (Dynamic Random Access Memory) 11 as a first storing unit, a NAND flash memory (hereinafter, "NAND memory") 12 as a second storing unit, a power supply circuit 13, and a drive control unit 14.

The DRAM 11 is used as a storing unit for data transfer, management information recording, or a work area. Specifically, when the DRAM 11 is used as a storing unit for data transfer, the DRAM 11 is used for temporarily storing data requested by the host apparatus to be written before the data is written in the NAND memory 12, and the DRAM 11 is used to read out data requested by the host apparatus to be read out from the NAND memory 12 and temporarily storing the read data. When the DRAM 11 is used as a storing unit for management information recording, the DRAM 11 is used for storing management information for managing storage positions of data stored in the DRAM 11 and the NAND memory 12. When the DRAM 11 is used as a storing unit for a work area, the DRAM 11 is used, for example, during expansion of pre and post logs (a pre-update log and a post-update log) used when management information is restored.

The NAND memory 12 is used as a storing unit for storing therein data. Specifically, the NAND memory 12 stores therein data designated by the host apparatus and stores therein, for backup, management information managed by the DRAM 11. In FIG. 1, the NAND memory 12 that includes four channels 120A to 120D has been shown as an example. Each of the channels 120A to 120D includes two packages 121 each including eight chips 122 having a storage capacity of a predetermined size (e.g., 2 GB). The channels 120A to 120D are connected via the drive control unit 14 and buses 15A to 15D.

The power supply circuit 13 receives external power supply and generates a plurality of internal power supplies to be supplied to respective units of the memory system 10 from the external power supply. The power supply circuit 13 detects a state of the external power supply, i.e., a rising edge or a falling edge, generates a power-on reset signal based on the detected state, and outputs the power-on reset signal to the drive control unit 14.

The drive control unit 14 controls the DRAM 11 and the NAND memory 12. As explained in detail later, for example, the drive control unit 14 performs restoration processing for management information and storage processing for management information according to the power-on reset signal from the power supply circuit 13. The drive control unit 14 transmits and receives data to and from a host apparatus via an ATA interface (I/F) and transmits and receives data to and from a debugging apparatus via an RS232C I/F. Furthermore, the drive control unit 14 outputs a control signal for controlling on/off of an LED for state display provided on the outside of the memory system 10.

Figure 2:
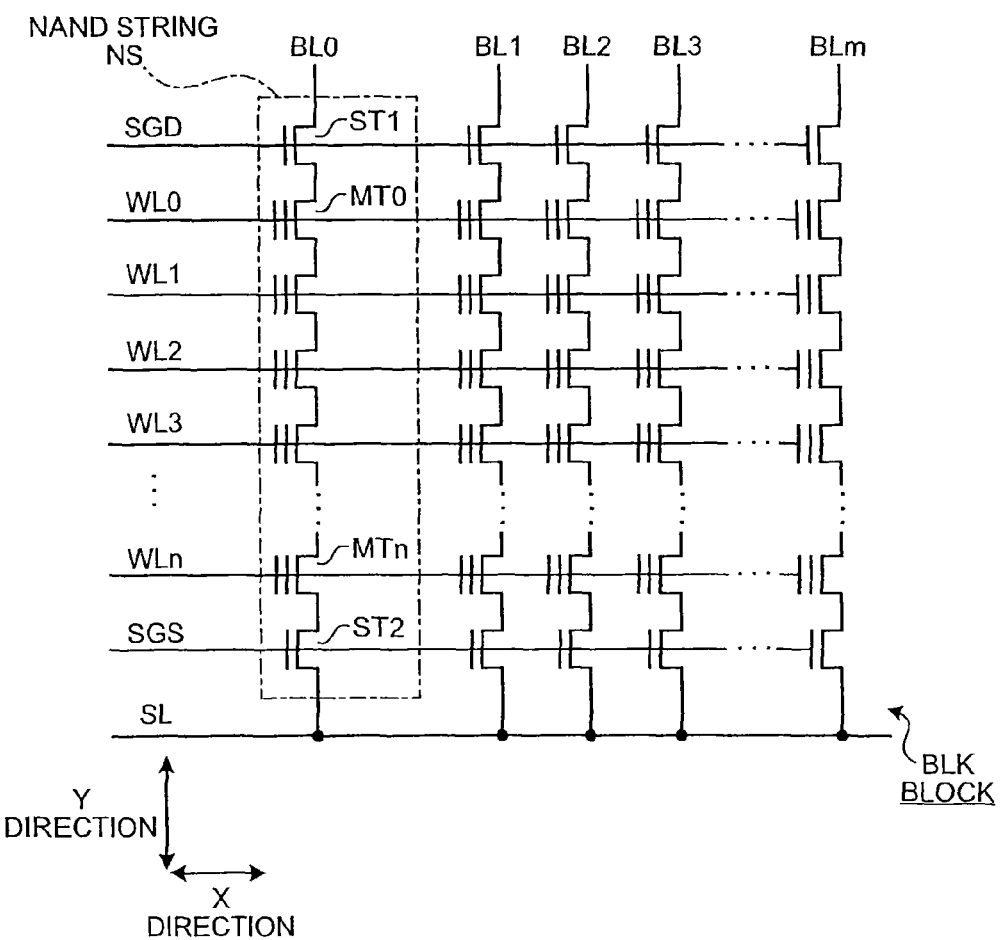
FIG. 2 is a circuit diagram of an example of a configuration of an arbitrary block of a NAND memory.

A configuration of the NAND memory 12 is explained in detail below. The NAND memory 12 is configured by arraying a plurality of blocks (erasing unit areas), which are units of data erasing, on a substrate. FIG. 2 is a circuit diagram of an example of a configuration of an arbitrary block of the NAND memory 12. In FIG. 2, left-right direction is set as an X direction and a direction perpendicular to the X direction is set as a Y direction.

Each block BLK of the NAND memory 12 includes (m+1) (m is an integer equal to or larger than 0) NAND strings NS arrayed in order along the X direction. Each NAND string NS has (n+1) (n is an integer equal to or larger than 0) memory cell transistors MT0 to MTn that share a diffusion region (a source region or a drain region) between memory cell transistors MT adjacent to each other in the Y direction. Moreover, the memory cell transistors MT0 to MTn are connected in series in the Y direction. In addition, selection transistors ST1 and ST2 arranged at both ends of a row of the (n+1) memory transistors MT0 to MTn.

Each memory cell transistors MT0 to MTn is a MOSFET (Metal Oxide Semiconductor Field Effect Transistor) having a stacked gate structure formed on a semiconductor substrate. The stacked gate structure includes a charge accumulation layer (a floating gate electrode) formed on the semiconductor substrate via a gate insulating film and a control gate electrode formed on the charge accumulating layer via an inter-gate insulating film. Moreover, the memory cell transistors MT0 to MTn are multi-value memories in which a threshold voltage changes according to the number of electrons accumulated in the floating gate electrode and 2 or more bit data can be stored depending on the difference in the threshold voltage. In the first embodiment, it is assumed that a memory cell transistor MT is the multi-value memory.

Word lines WL0 to WLn are respectively connected to the control gate electrodes of the memory cell transistors MT0 to MTn of each NAND string NS. Memory cell transistors MTi (i=0 to n) in each of the NAND strings NS are connected in common by the same word lines (i=0 to n). In other words, the control gate electrodes of the memory cell transistors MTi present on the same row in the block BLK are connected to the same word line WLi. A group of (m+1) memory cell transistors MT1 connected to the same word line WLi are a unit forming one page. In the NAND memory 12, writing and readout of data are performed in this page unit.

Bit lines BL0 to BLm are respectively connected to drains of the (m+1) selection transistors ST1 in one block BLK. A selection gate line SGD is connected in common to gates of the selection transistors ST1 of each NAND string NS. Sources of the selection transistors ST1 are connected to drains of the memory cell transistors MT0. Similarly, a source line SL is connected in common to sources of the (m+1) selection transistors ST2 in one block BLK. A selection gate line SGS is connected in common to gates of the selection transistors ST2 of each NAND string NS. Drains of the selection transistors ST2 are connected to sources of the memory cell transistors MTn.

Although not shown in the figure, bit lines BLj (j=0 to m) in one block BLK connect drains of the selection transistors ST1 in common between bit lines BLj of other blocks BLK. In other words, the NAND strings NS in the same column in the blocks BLK are connected by the same bit line BLj.

Figure 3A:
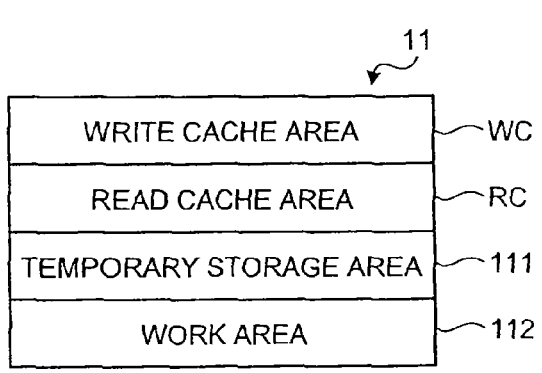
FIG. 3A is a schematic diagram of a functional configuration of a DRAM and FIG. 3B is a schematic diagram of a functional configuration of the NAND memory.
Figure 3B:
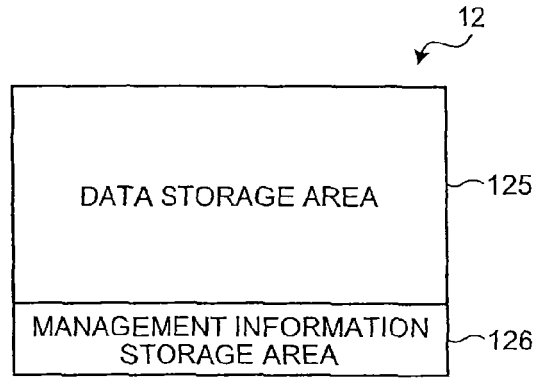

Functional configurations of the DRAM 11 and the NAND memory 12 are explained next. FIG. 3A is a schematic diagram of a functional configuration of the DRAM 11 and FIG. 3B is a schematic diagram of a functional configuration of the NAND memory 12. As shown in FIG. 3A, the DRAM 11 includes a write cache area in which data requested by the host apparatus to be written is stored, a read cache area RC in which data requested by the host apparatus to be read out is stored, a temporary storage area 111 in which management information for managing storage positions of data stored in the DRAM 11 and the NAND memory 12 is stored, and a work area 112 used when the management information is restored.

As shown in FIG. 3B, the NAND memory 12 includes a data storage area 125 in which data requested by the host apparatus to be written is stored and a management information storage area 126 in which the management information managed in the temporary storage area 111 of the DRAM 11 is stored. In this example, a data writing and readout unit in the NAND memory 12 is set as a page size unit. An erasing unit is set as a block size unit. Therefore, an area for storing respective blocks of the NAND memory 12 managed in block size units is further divided into areas of page size units.

Figure 4:
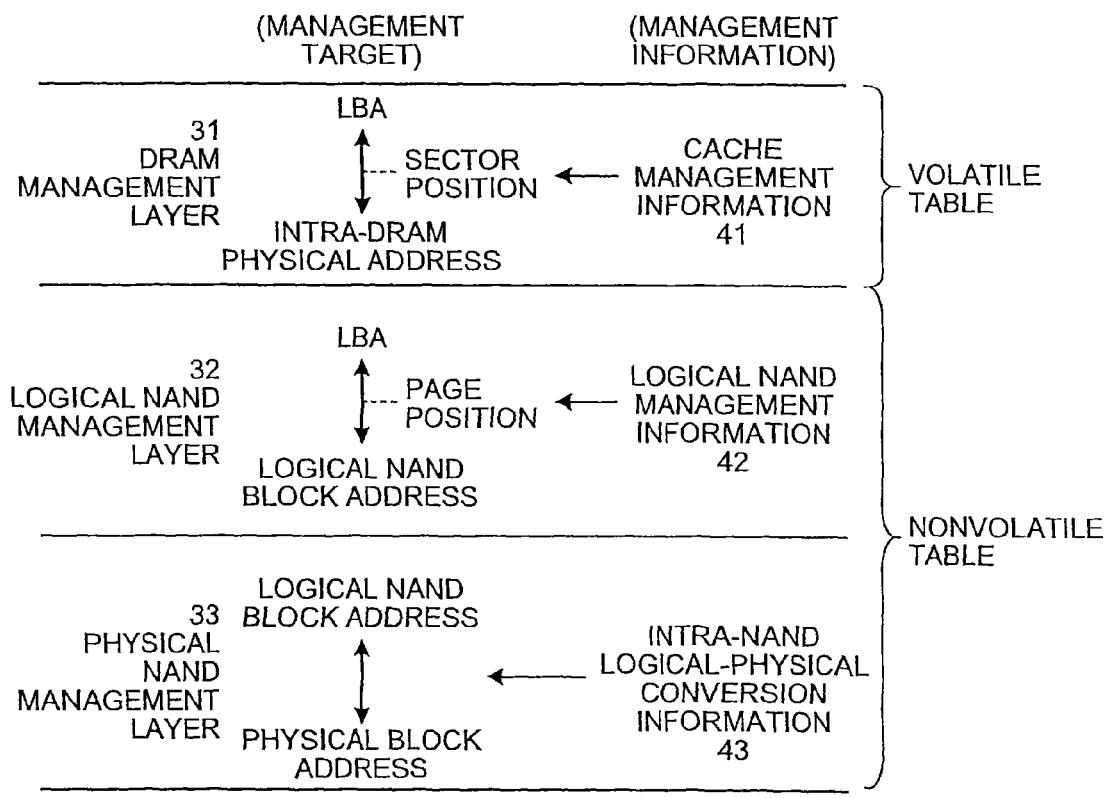
FIG. 4 is a diagram of an example of a layer structure for managing data stored in the memory system.

The management information managed in the temporary storage area ill of the DRAM 11 is explained below. FIG. 4 is a diagram of an example of a layer structure for managing data stored in the memory system 10. It is assumed here that this data is the data requested by the host apparatus to be written or read out. In the memory system 10, data management is performed by a three-layer structure: a DRAM management layer 31, a logical NAND management layer 32, and a physical NAND management layer 33. The DRAM management layer 31 performs data management in the DRAM 11 that plays a role of a cache. The logical NAND management layer 32 performs logical data management in the NAND memory 12. The physical NAND management layer 33 performs physical data management in the NAND memory 12, life extension processing for the NAND memory 12, and the like.

In the write cache area WC and the read cache area RC of the DRAM 11, data designated by a logical address (hereinafter, "LBA (Logical Block Address)") managed by an address managing method of the host apparatus is stored in a physical address in a predetermined range on the DRAM 11 (hereinafter, "intra-DRAM physical address"). Data in the DRAM management layer 31 is managed by cache management information 41 including a correspondence relation between an LBA of data to be stored and the intra-DRAM physical address and a sector flag indicating presence or absence of data in sector size units in a page.

Figure 5:
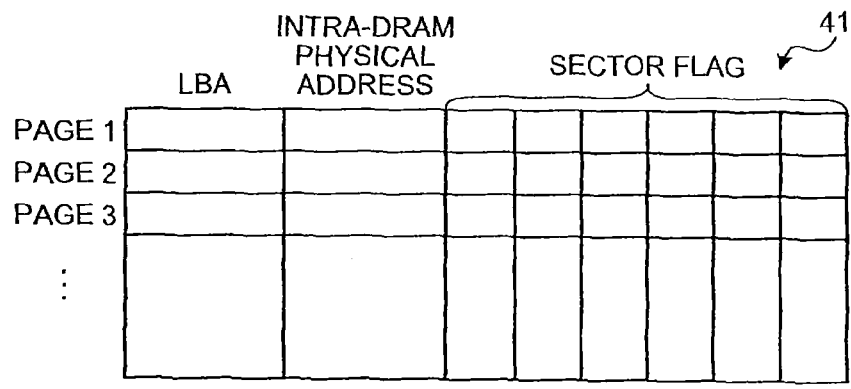
FIG. 5 is a diagram of an example of a cache management information table.

FIG. 5 illustrates an example of the cache management information 41 in tabular manner. The cache management information 41 is one entry for one area of a one page size of the DRAM 11. The number of entries is equal to or smaller than the number of pages that fit in the write cache area WC and the read cache area RC. In each of the entries, the LBA of data of a page size, the intra-DRAM physical address, and a sector flag indicating a position of valid data in each of areas obtained by dividing this page by a sector size are associated.

In the NAND memory 12, data from the DRAM 11 is stored in a physical address in a predetermined range (hereinafter, "intra-NAND physical address") on the NAND memory 12. In the NAND memory 12 formed by the multi-value memory, because the number of rewritable times is limited, the numbers of times of rewriting among the blocks configuring the NAND memory 12 are controlled by the drive control unit 14 to be equalized. In other words, when update of data written in a certain intra-NAND physical address in the NAND memory 12 is performed, the drive control unit 14 performs control to equalize the numbers of times of rewriting among the blocks configuring the NAND memory 12 to write, in a block different from the original block, data reflecting a portion required to be updated of a block in which the data to be updated is included and invalidate the original block.

As explained above, in the NAND memory 12, processing units are different in the writing and readout processing for data and the erasing processing for data. In the update processing for data, a position (a block) of data before update and a position (a block) of data after update are different. Therefore, in the first embodiment, an intra-NAND logical address used independently in the NAND memory 12 (hereinafter, "intra-NAND logical address") is provided besides the intra-NAND physical address.

Therefore, data in the logical NAND management layer 32 is managed by logical NAND management information 42 indicating a relation between an LBA of data in page size units received from the DRAM 11 and an intra-NAND logical address indicating a logical page position of the NAND memory 12 in which the received data is stored and a relation indicating an address range of a logical block having a size coinciding with that of a block as an erasing unit in the NAND memory 12. A collection of a plurality of the logical blocks can be set as a logical block. Data in the physical NAND management layer 33 is managed by intra-NAND logical address-physical address conversion information (hereinafter, "logical-physical conversion information") including a correspondence relation between the intra-NAND logical address and the intra-NAND physical address in the NAND memory 12.

Figure 6:
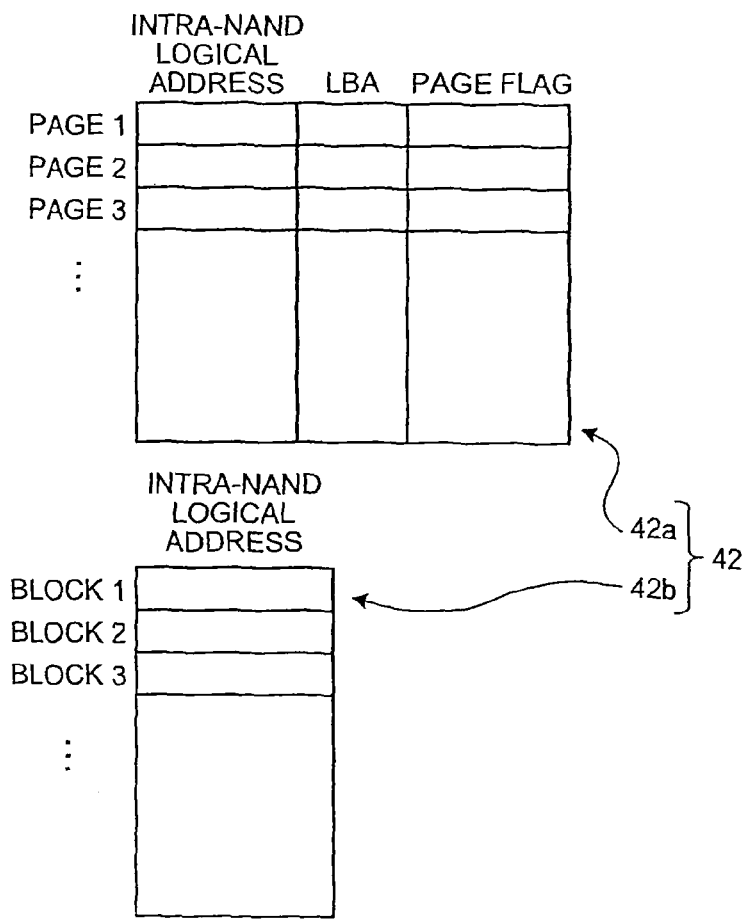
FIG. 6 is a diagram of an example of a logical NAND management information table.
Figure 7:
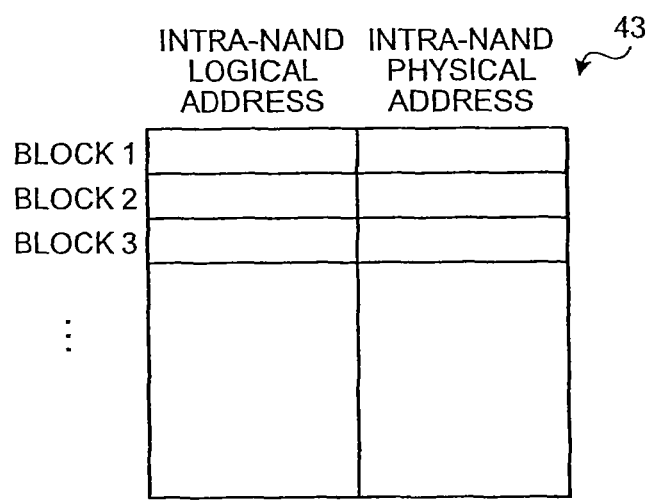
FIG. 7 is a diagram of an example of an intra-NAND logical-physical conversion information table.

FIG. 6 illustrates an example of the logical NAND management information 42 in tabular manner. FIG. 7 illustrates an example of intra-NAND logical-physical conversion information 43 in tabular manner. As shown in FIG. 6, the logical NAND management information 42 includes logical page management information 42a and logical block management information 42b. The logical page management information 42a has one entry for one logical area of a one page size. Each of entries includes an LBA of data of the one page size, an intra-NAND logical address, and a page flag indicating whether this page is valid. The logical block management information 42b includes an intra-NAND physical address set for an area of the one block size of the NAND memory 12. As shown in FIG. 7, in the intra-NAND logical-physical conversion information 43, the intra-NAND physical address and the inter-NAND logical address of the NAND memory 12 are associated.

By using these kinds of management information, a correspondence of the LBA used in the host apparatus, the intra-NAND logical address used in the NAND memory 12, and the intra-NAND physical address used in the NAND memory 12 can be established. This makes it is possible to exchange data between the host apparatus and the memory system 10.

The management information managed by the DRAM management layer 31 is lost because of power-off or the like so that this management information can be called a volatile table. On the contrary, if the management information managed by the logical NAND management layer 32 and the physical NAND management layer 33 is lost because of power-off or the like, the lost management information hinders successful startup of the memory system 10 so that measures are required to be taken such that the management information is stored even in the event of power-off or the like. Therefore, this management information can be called a nonvolatile table.

This nonvolatile table manages data stored in the NAND memory 12. If the nonvolatile table is not present, information stored in the NAND memory 12 cannot be accessed or data stored in an area is erased. Therefore, the nonvolatile table needs to be stored as latest information in preparation for sudden power-off. Therefore, in the first embodiment, management information including at least the nonvolatile table is stored in the latest state in the management information storage area 126 of the NAND memory 12. The management information storage information stored in the management information storage area 126 of the NAND memory 12 is explained below. The following explanation assumes that only the nonvolatile table is stored in the management information storage area 126.

Figure 8:
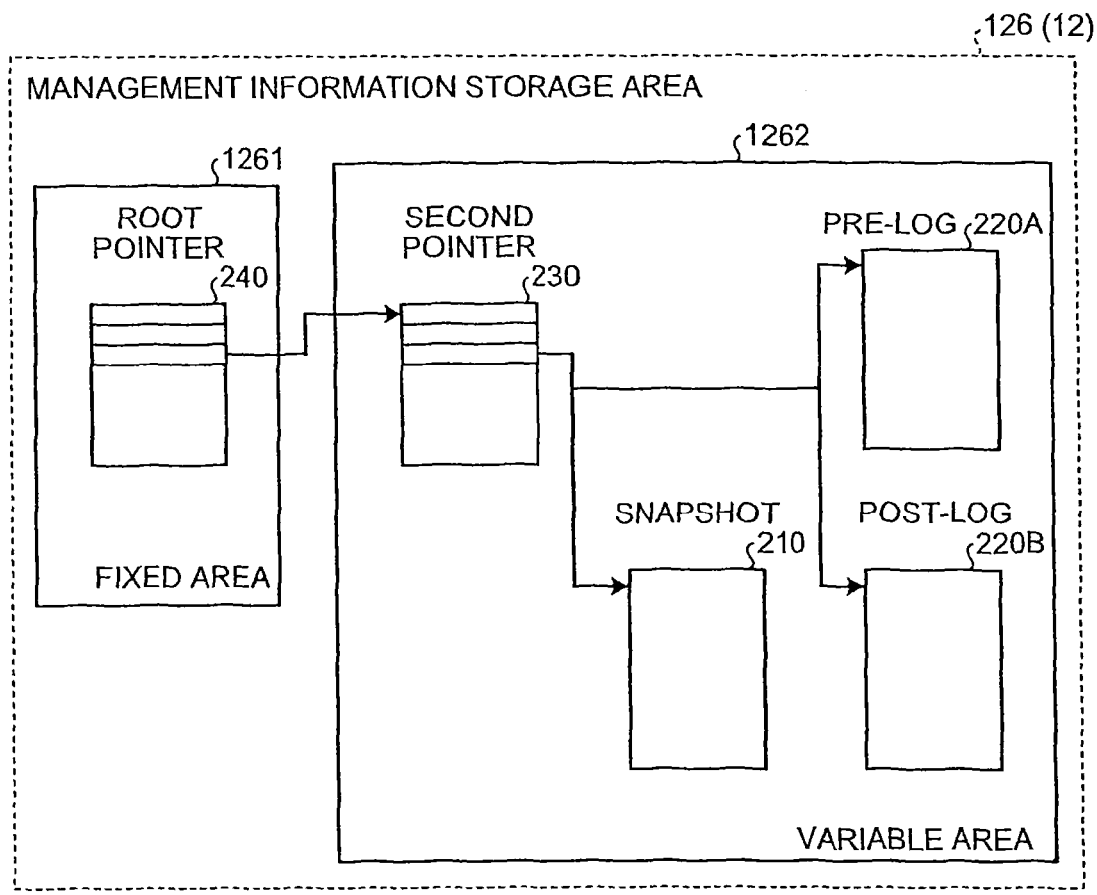
FIG. 8 is a schematic diagram of an example of contents of management information storage information stored in a management information storage area.

FIG. 8 is a schematic diagram of an example of contents of the management information storage information stored in the management information storage area 126. Following items are stored in the management information storage area 126: management information storage information including a snapshot 210 as contents of the nonvolatile table at a certain point, a pre-update log (hereinafter referred to as pre-log) 220A, which is update difference information of contents of the nonvolatile table before taking a snapshot next time and is acquired before update, an post-update log (hereinafter referred to as post-log) 220B, which is log information of contents same as those of the pre-log 220A and is stored after the update, a second pointer 230 indicating the position (a block) of the snapshot 210, the position (a block) of the pre-log 220A acquired for the snapshot 210, and the position (a block) of the post-log 220B acquired from the snapshot 210, and a root pointer 240 indicating the position (a block) where the second pointer 230 is stored is stored. The snapshot 210 is information obtained by storing management information including at least the nonvolatile table at a predetermined point among the management information stored in the temporary storage area 111 of the DRAM 11.

The snapshot 210, the pre-log 220A, the post-log 220B, the second pointer 230, and the root pointer 240 are stored in different blocks. The size of the blocks is the same as the size of a physical block as an erasing unit. The snapshot 210 is stored in a snapshot storing block. The snapshot 210 includes the logical NAND management information 42 and the intra-NAND logical-physical conversion information 43 as nonvolatile tables in the management information storage area 126 of the NAND memory 12. When a new snapshot 210 is stored, the snapshot 210 is stored in a block different from that of the snapshot 210 stored before.

The pre-log 220A and the post-log 220B are difference information between the nonvolatile table after contents are changed when there is a change in contents of the nonvolatile table and the snapshot 210 (or the snapshot 210 and a log already generated) corresponding to the data writing processing, etc. Specifically, a first pre-log 220A and a first post-log 220B after the snapshot 210 is taken are difference information between the nonvolatile table and the snapshot 210. A second or subsequent pre-log 220A after the snapshot 210 is taken is difference information between a combination of the pre-log 220A already generated and the snapshot 210 and the nonvolatile table. A second or subsequent post-log 220B after the snapshot 210 is taken is difference information between a combination of the post-log 220B already generated and the snapshot 210 and the nonvolatile table.

The pre-log 220A is information generated before the management information is actually updated. Therefore, before the management information is actually updated by the execution of data writing processing or the like, the pre-log 220A is generated based on an update schedule concerning how the management information is updated.

The post-log 220B is information generated after the management information is actually updated. Therefore, the post-log 220B is generated by using the actual management information after the management information is actually updated according to the execution of data writing processing or the like.

The pre-log 220A and the post-log 220B are stored in log storing blocks, respectively. The pre-log 220A and the post-log 220B are written in the same log storing blocks in a write-once manner even if a generation of the snapshot changes.

Figure 9:
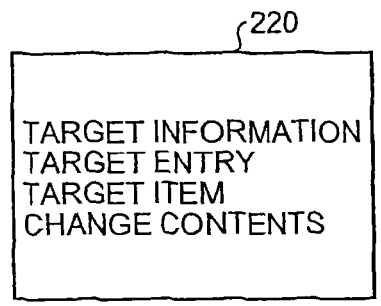
FIG. 9 depicts an example of a log.

FIG. 9 depicts an example of a log. Because the pre-log 220A and the post-log 220B have the same information, the pre-log 220A is explained as an example of the log. The pre-log 220A includes target information to be management information of a change target, a target entry as an entry to be a change target in the target information, a target item as an item to be a change target in the target entry, and change contents as content of a change of the target item. The pre-log 220A and the post-log 220B are reformed with storage of the new snapshot 210 because the pre-log 220A and the post-log 220B are update difference information for the snapshot 210.

The second pointer 230 is stored in a second pointer storing block. The second pointer 230 only has to be a pointer that indicates a top address of a block indicating storage positions of the snapshot 210, the pre-log 220A, and the post-log 220B. The second pointer 230 is updated when the snapshot 210 is stored anew or when a snapshot storing block or a log storing block is changed. Pointers of the pre-log 220A and the post-log 220B can be stored in the snapshot 210 instead to storing them in the second pointer storing block.

The second pointer 230 includes snapshot access information for accessing the snapshot storing block, log access information for accessing the log storing blocks for the pre-log 220A and the post-log 220B, and a next pointer indicating a page position where the next second pointer is stored. The second pointer 230 is changed to information in a linked list system by this next pointer. It is possible to reach the latest second pointer 230 by tracking the next pointer from the top page of the second pointer storing block designated by the root pointer 240. Instead of the linked list system, the second pointer 230 can be stored in a write-once manner in order from the top page of the second pointer storage area.

The root pointer 240 is stored in a first root pointer storing block. The root pointer 240 is information for accessing the second pointer storing block in which the second pointer 230 is stored and is information read first in processing for restoring the management information when the memory system 10 is started. The root pointer 240 is changed when the second pointer storing block is changed. The root pointer 240 is stored in the root pointer storing block in a write-once manner in order from a top page of the block. In such a case, a page immediately preceding an unwritten page in the root pointer storing block has latest information. Therefore, it is possible to retrieve the latest root pointer 240 by retrieving a highest order page of the unwritten page. As in the case of the second pointer 230, it is also possible to use a linked list.

The root pointer 240 is stored in a fixed area 1261 in the NAND memory 12. The snapshot 210, the pre-log 220A, the post-log 220B, and the second pointer 230 are stored in a variable area 1262 in the NAND memory 12. The fixed area 1261 is a protected area in which a relation between a logical block managed by the logical NAND management layer 32 and a physical block managed by the physical NAND management layer 33 is fixed in the NAND memory 12 and is an area in which information necessary for running the memory system 10 and having a low update frequency in which rewriting and writing hardly occurs is stored.

The variable area 1262 is an area in which the relation between the logical block managed by the logical NAND management layer 32 and the physical block managed by the physical NAND management layer 33 is variable in an area of the NAND memory 12 excluding the fixed area 1261 and is an area as a target of wear leveling.

Figure 10:
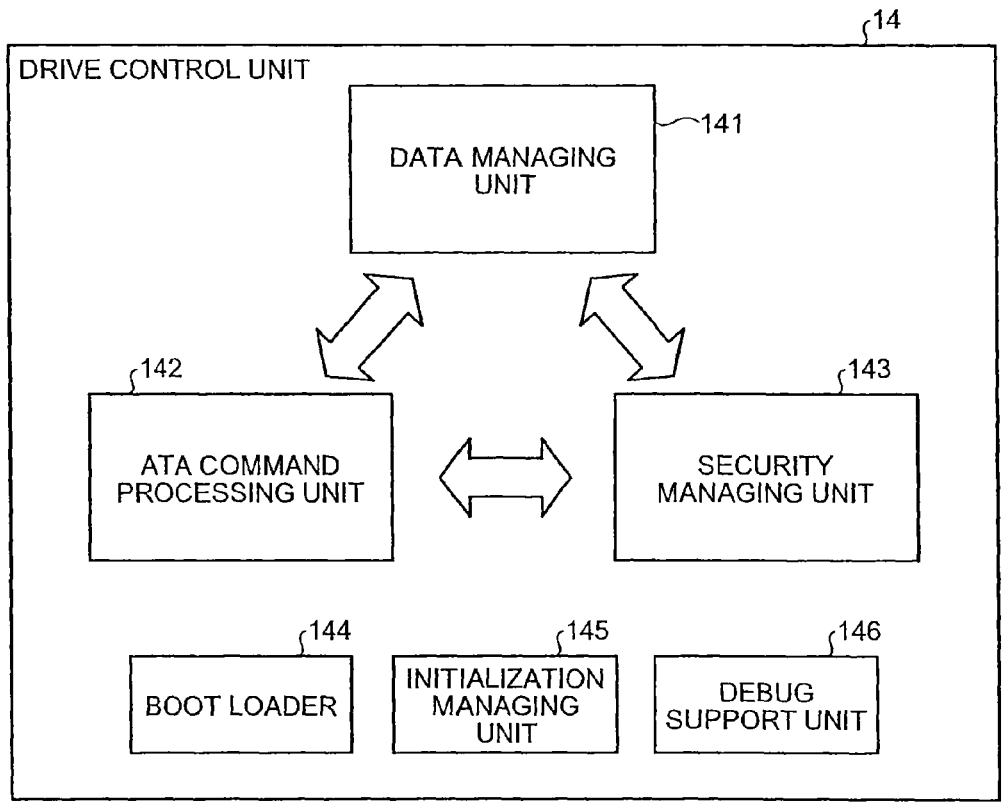
FIG. 10 is a block diagram of an example of a functional configuration of a drive control unit shown in FIG. 1.

Functions of the drive control unit 14 are explained below. FIG. 10 is a block diagram of an example of a functional configuration of the drive control unit 14. The drive control unit 14 includes a data managing unit 141, an ATA-command processing unit 142, a security managing unit 143, a boot loader 144, an initialization managing unit 145, and a debug support unit 146. The data managing unit 141 performs data transfer between the DRAM 11 and the NAND memory 12 and control of various functions concerning the NAND memory 12. The ATA-command processing unit 142 performs data transfer processing in cooperation with the data managing unit 141 based on an instruction received from an ATA interface. The security managing unit 143 manages various kinds of security information in cooperation with the data managing unit 141 and the ATA-command processing unit 142. The boot loader 144 loads, during power-on, various management programs (firmware) from the NAND memory 12 to a not-shown memory (e.g., SRAM (Static RAM)). The initialization managing unit 145 performs initialization of controllers and circuits in the drive control unit 14. The debug support unit 146 processes debug data supplied from the outside via an RS232C interface.

Figure 11:
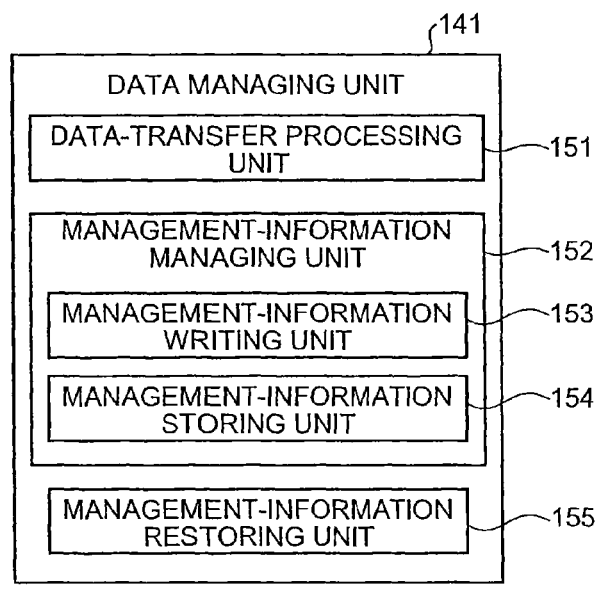
FIG. 11 is a block diagram of an example of a functional configuration of a data managing unit shown in FIG. 10.

FIG. 11 is a block diagram of an example of a functional configuration of the data managing unit 141. The data managing unit 141 includes a data-transfer processing unit 151, a management-information managing unit 152, and a management-information restoring unit 155. The data-transfer processing unit 151 performs data transfer between the DRAM 11 and the NAND memory 12. The management-information managing unit 152 performs change and storage of management information according to a change of data stored in the DRAM 11 and the NAND memory 12. The management-information restoring unit 155 restores latest management information based on management information stored during power-on or the like.

The management-information managing unit 152 includes a management-information writing unit 153 and a management-information storing unit 154. The management-information writing unit 153 performs update of the management information stored in the DRAM 11 when update of the management information is necessary according to the change processing for data stored in the DRAM 11 or the NAND memory 12 by the data-transfer processing unit 151.

When the memory system 10 satisfies a predetermined condition, the management-information storing unit 154 stores, in the management information storage area 126 of the NAND memory 12, the management information as the snapshot 210, information to be updated in the management information as the pre-log 220A, and updated information in the management information as the post-log 220B. When a position of writing in the second pointer 230 is changed according to storage of the snapshot 210, the pre-log 220A, or the post-log 220B, the management-information storing unit 154 applies update processing to the second pointer 230.

Storing of the snapshot 210 is performed by the management-information storing unit 154 when a predetermined condition relating to the memory system 10 is satisfied. Storing of the snapshot 210 is performed, for example, when a log storage area provided for storing a log 220 (the pre-log 220A and the post-log 220B) in the management information storage area 126 of the NAND memory 12 becomes full (i.e., the area is completely filled with data).

Storing of the log 220 (the pre-log 220A and the post-log 220B) is performed by the management-information storing unit 154 during data update (when data writing in the NAND memory 12 is necessary) on the NAND memory 12 involving update of the management information (the nonvolatile table) stored in the DRAM 11.

Timing when the management-information storing unit 154 stores the pre-log 220A and the post-log 220B is the time when update of the management information (the nonvolatile table) stored in the DRAM 11 is performed by the management-information writing unit 153. Specifically, the pre-log 220A and the post-log 220B are stored before and after processing for performing data writing and the like.

When the power supply of the memory system 10 is turned on, the management-information restoring unit 155 performs restoration processing for management information based on the management information storage information stored in the management information storage area 126 of the NAND memory 12. Specifically, the management-information restoring unit 155 traces the root pointer 240 in the fixed area 1261 and the second pointer 230, the snapshot 210, the pre-log 220A, and the post-log 220B in the variable area 1262 in order and determines whether the pre-log 220A and the post-log 220B corresponding to the latest snapshot 210 are present. When the pre-log 220A and the post-log 220B are not present, the management-information restoring unit 155 restores, in the DRAM 11, the snapshot 210 of the snapshot storing block as management information. When the pre-log 220A and the post-log 220B are present, it means that an abnormal end such as a program error or short break (abnormal isolation of the power supply) has occurred, the management-information restoring unit 155 acquires the snapshot 210 from the snapshot storing block, acquires the pre-log 220A and the post-log 220B from the log storing block, and performs restoration of the management information (the nonvolatile table) reflecting the pre-log 220A and the post-log 220B on the snapshot 210 on the DRAM 11.

Figure 12:
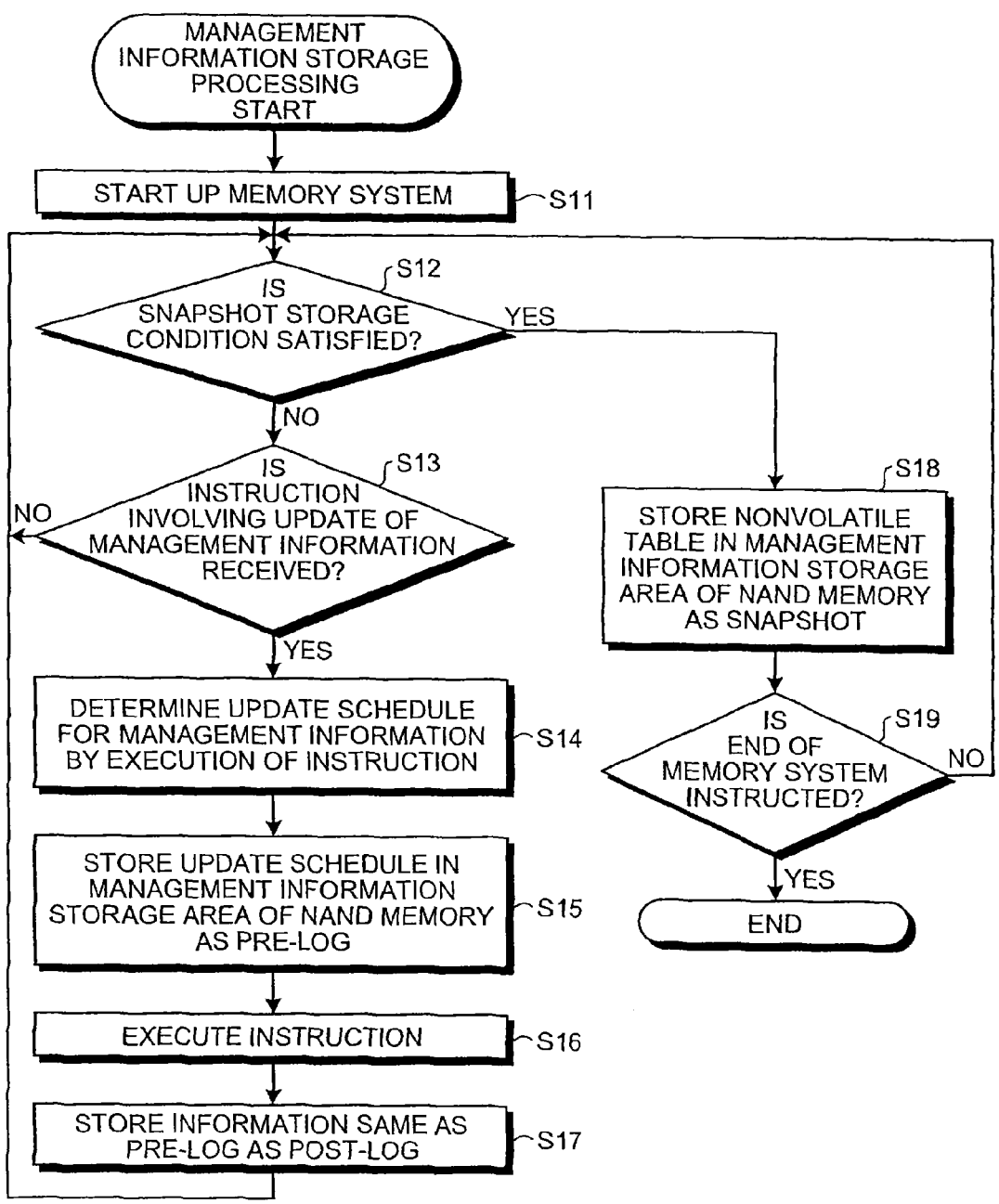
FIG. 12 is a flowchart of an example of a storage processing procedure for management information of the memory system.
Figure 13:
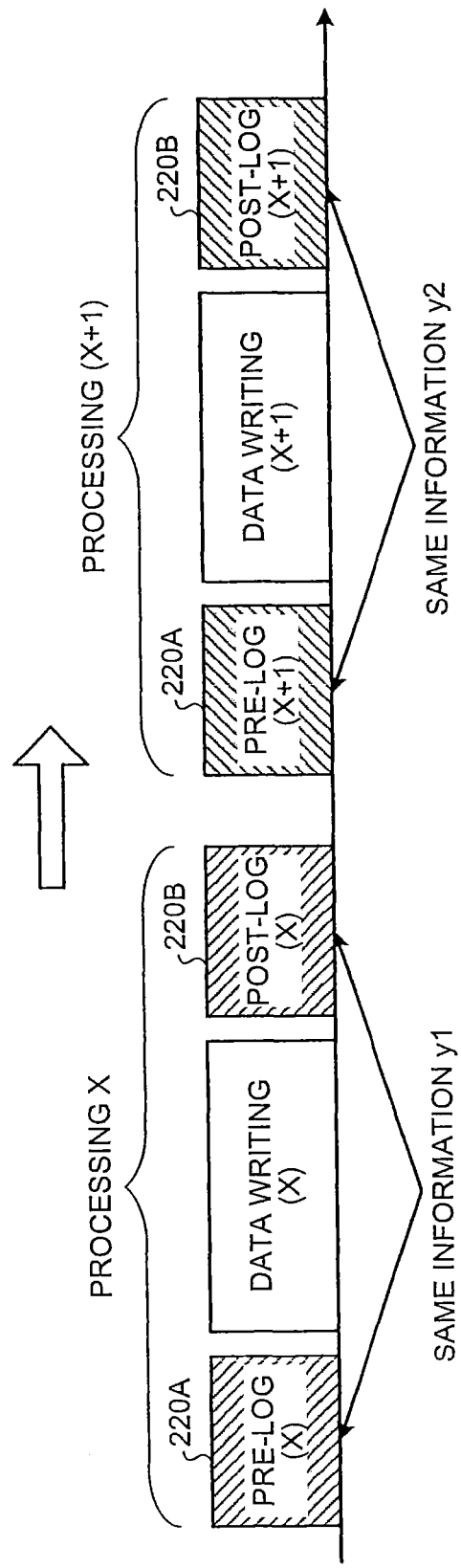
FIG. 13 is a diagram for explaining storage processing for a pre-log and a post-log.

Storage processing for the management information of the memory system 10 by the management-information managing unit 152 is explained below. FIG. 12 is a flowchart of an example of a storage processing procedure for the management information of the memory system 10. FIG. 13 is a diagram for explaining storage processing for the pre-log and the post-log. It is assumed that the memory system 10 is connected to a host apparatus and operates as a secondary storage device of the host apparatus, the host apparatus (the memory system 10) is in a startup state, and the snapshot 210 is stored before the stop of the memory system 10 before this startup state.

First, the host apparatus (the memory system 10) is in a started state based on the snapshot 210 stored at the last end of the host apparatus (the memory system 10) (Step S11). Thereafter, data reading or writing from the host apparatus to the NAND memory 12 is performed when necessary. The management-information managing unit 152 determines whether a predetermined snapshot storage condition (e.g., the log storage area is full (the area is full with log data)) is satisfied (Step S12). When the snapshot storage condition is not satisfied ("No" at Step S12), the management-information managing unit 152 determines whether an instruction involving update of the management information (an instruction for data writing in the NAND memory) is received (Step S13). When the instruction involving update of the management information is not received ("No" at Step S13), the management-information managing unit 152 returns to Step S12.

When the instruction involving update of the management information is received ("Yes" at Step S13), the management-information managing unit 152 determines an update schedule indicating how the management information is to be updated by executing the instruction (Step S14). The management-information managing unit 152 stores the update schedule in the log storing block of the management information storage area 126 of the NAND memory 12 as the pre-log 220A (Step S15). When the pre-log 220A is not stored in the log storing block, the update schedule (the log) is difference information between the nonvolatile table at the time when the management information is updated and the snapshot 210 stored in the snapshot storing block. When the log 220 (hereinafter referred to as past pre-log 220A) is already stored in the log storing block, the update schedule (the log) is difference information between the nonvolatile table at the time when the management information is updated and a combination of the snapshot 210 and the past pre-log 220A. Specifically, as shown in FIG. 13, before data writing (X) is performed as writing processing for Xth data, a pre-log (X) corresponding to the data writing (X) is stored in the NAND memory 12 as the pre-log 220A. At this point, for example, the information y1 is stored as the pre-log 220A. The pre-log 220A is stored in the management information storage area 126 of the NAND memory 12, for example, after the pre-log 220A (the update schedule) is recorded on the DRAM 11.

Subsequently, the logical NAND management layer 32 executes the instruction received at Step S13 (e.g., processing for writing (X) of user data in the data storage area 125 of the NAND memory 12) (Step S16).

Thereafter, the management information stored in the DRAM 11 is updated according to the executed processing. The management-information storing unit 154 stores updated information in the management information in the management information storage area 126 of the NAND memory 12 as the post-log 220B. When the post-log 220B is not stored in the log storing block, the post-log 220B is difference information between the nonvolatile table at the present point and the snapshot 210 stored in the snapshot storing block. When the post-log 220B (hereinafter referred to as past post-log 220B) is already stored in the log storing block, the post-log 220B is difference information between the nonvolatile table at the present table and a combination of the snapshot 210 and a past log.

A post-log 220B (X) corresponding to the data writing (X) is stored in the NAND memory 12 as the post-log 220B. At this point, for example, the information y1 is stored as the post-log 220B. The information y1 stored as the post-log 220B is the same as the information y1 stored as the pre-log 220A (Step S17). Thereafter, the management-information managing unit 152 returns to Step S12.

When the snapshot storage condition is not satisfied ("No" at Step S12) and when the instruction involving update of the management information is received ("Yes" at Step S13), processing at Steps S14 to S17 is performed. In other words, writing processing for (X+1)th data is performed in the same manner as the writing processing for the Xth data. Before data writing (X+1) is performed as the writing processing for the (X+1)th data, a pre-log (X+1) corresponding to the data writing (X+1) is stored in the NAND memory 12 as the pre-log 220A. At this point, for example, information y2 is stored as the pre-log 220A. The data writing (X+1) in the data storage area 125 in the NAND memory 12 is performed. A post-log (X+1) corresponding to the data writing (X+1) is stored in the NAND memory 12 as the post-log 220B. At this point, for example, the information y2 is stored as the post-log 220B. The information y2 stored as the post-log 220B is the same as the information y2 stored as the pre-log 220A.

When the snapshot storage condition is satisfied at Step S12 ("Yes" at Step S12), the management-information managing unit 152 stores management information including at least the nonvolatile table in the temporary storage area 111 of the DRAM 11 in the management information storage area 126 of the NAND memory 12 as the snapshot 210 (Step S18). The management-information managing unit 152 determines whether the end of the memory system 10 is instructed (Step S19). When the end of the memory system 10 is not instructed, the management-information managing unit 152 returns to Step S12. When the end of the memory system 10 is instructed, the processing is finished.

Figure 14:
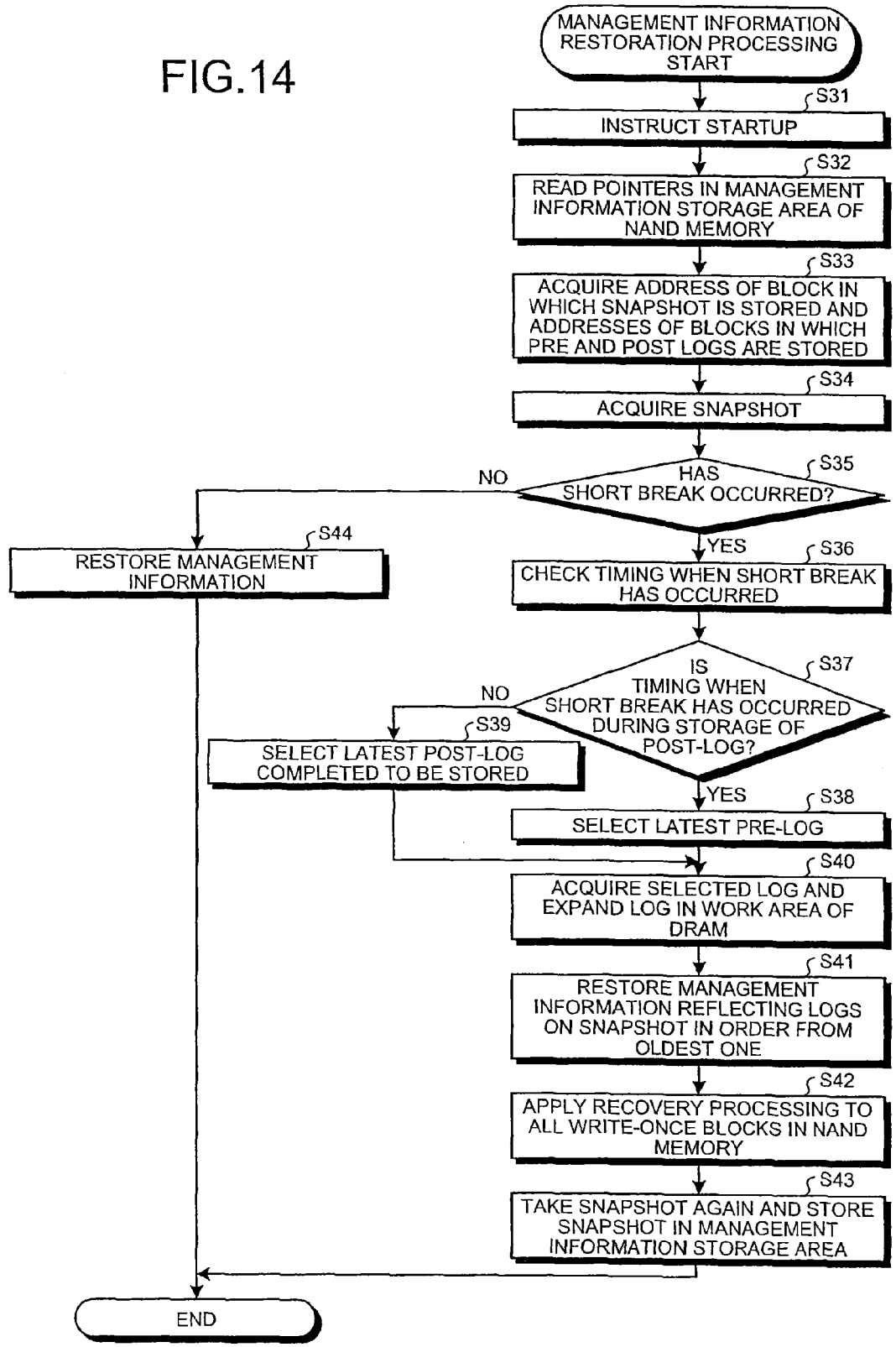
FIG. 14 is a flowchart of an example of a restoration processing procedure for management information of the memory system.

Restoration processing for management information of the memory system 10 performed by the management-information restoring unit 155 is explained below. FIG. 14 is a flowchart of an example of a restoration processing procedure for the management information of the memory system 10. As in the above explanation, the memory system 10 is connected to the host apparatus and operates as the second storage device of the host apparatus.

First, the power supply of the host apparatus is turned on because of, for example, recovery from a short break, and a startup instruction is issued to the memory system 10 (Step S31). The management-information restoring unit 155 sequentially reads the root pointer 240 and the second pointer 230 in the management information storage area 126 of the NAND memory 12 (Step S32), acquires addresses of the blocks in which the snapshot 210 and the pre and post logs (the pre-log 220A and the post-lot 220B) are stored (Step S33), and acquires the snapshot 210 (Step S34).

Thereafter, the management-information restoring unit 155 determines whether a short break has occurred referring to the pre-log 220A and the post-log 220B in the NAND memory 12 (Step S35). For example, when the pre-log 220A and the post-log 220B are present in the NAND memory 12, the management-information restoring unit 155 determines that a short break has occurred. The determination on whether a short break has occurred can be performed by, for example, comparing the pre-log 220A and the post-log 220B. In the first embodiment, the pre-log 220A and the post-log 220B store the same information. Therefore, for example, when the number of pages stored as the pre-log 220A and the number of pages stored as the post-log 220B do not coincide with each other, it means that a short break has occurred. The occurrence of a short break can also be determined based on presence or absence of an ECC error, data of a page stored as the pre-log 220A, and data of a page stored as the post-log 220B.

When the short break has occurred ("Yes" at Step S35), the management-information restoring unit 155 checks, based on a latest pre-log 220A and a latest post-log 220B in the NAND memory 12, timing when the short break has occurred (Step S36).

Further, the management-information restoring unit 155 checks, based on the latest pre-log 220A and the latest post-log 220B in the NAND memory 12, timing when the short break has occurred (Step S36). The management-information restoring unit 155 determines whether the timing when the short break has occurred is during storage of the post-log 220B (Step S37). For example, when a last page in the post-log 220B is being written, this last page cannot be read out. Therefore, it is determined that the short break has occurred during storage of the post-log 220B. Further, because the short break has occurred during storage of the post-log 220B, lower order page data breakage may have occurred in the post-log 220B because of the short break. When a last page in the pre-log 220A is being written, this last page cannot be read out. Therefore, it is determined that the short break has occurred during storage of the pre-log 220A. Further, because the short break has occurred during storage of the pre-log 220A, lower order page data breakage may have occurred in the pre-log 220A because of the short break. When a log is written in the last page in the pre-log 220A and a log is not written in the past page in the post-log 220B, it is determined that the short break has occurred during writing of data.

When the management-information restoring unit 155 determines that the timing when the short break has occurred is during storage of the post-log 220B ("Yes" at Step S37), the management-information restoring unit 155 selects the latest pre-log 220A (Step S38). On the other hand, when the management-information restoring unit 155 determines that the timing when the short break has occurred is not during storage of the post-log 220B ("No" at Step S37), the management-information restoring unit 155 stores the latest post-log 220B completed to be stored (Step S39). In other words, when the last page in the pre-log 220A is being written or when a log is written in the last page in the pre-log 220A and a log is not written in the last page in the post-log 220B, the latest post-log 220B is selected.

Thereafter, the management-information restoring unit 155 acquires the selected log (the pre-log 220A or the post-log 220B) from the log storing block and expands the log in the work area 112 of the DRAM 11 (Step S40). The management-information restoring unit 155 restores the management information (the nonvolatile table) reflecting logs on the snapshot 210 in order from oldest one (Step S41). Subsequently, the management-information restoring unit 155 applies recovery processing to a write-once block (a log storing block) in the NAND memory 12 (Step S42). The influence of suspended processing is eliminated by determining presence or absence of breakage of the write-once block in the NAND memory 12 and performing the recovery processing. Presence or absence of breakage is determined by comparing a write-once state and contents of the management information with the write-once block. At a stage when the restoration of the management information and the recovery processing ends, the management-information restoring unit 155 takes the snapshot 210 again and stores the snapshot 210 in the management information storage area 126 (Step S43). The management-information restoring unit 155 changes the snapshot and the log in the past to free blocks (opens or discards the snapshot and the log) and the restoration processing for the management information is completed. The free block means a block to which an application is not allocated yet. When an application is allocated to the free block, the free block is used after being erased.

On the other hand, when short break has not occurred ("No" at Step S35), the management-information restoring unit 155 restores the management information in the temporary storage area 111 of the DRAM 11 (Step S44) and the management information restoration processing ends.

The management-information restoring unit 155 can select, regardless of presence or absence of breakage of logs due to short break, one of the pre-log 220A and the post-log 220B and restore the management information based on the number of pages stored as the pre-log 220A and the number of pages stored as the post-log 220B. For example, when the number of pages stored as the pre-log 220A and the number of pages stored as the post-log 220B are the same, the management-information restoring unit 155 selects the pre-log 220A and restores the management information. When the number of pages stored as the pre-log 220A is larger than the number of pages stored as the post-log 220B, the management-information restoring unit 155 selects the post-log 220B and restores the management information.

Figure 15A:
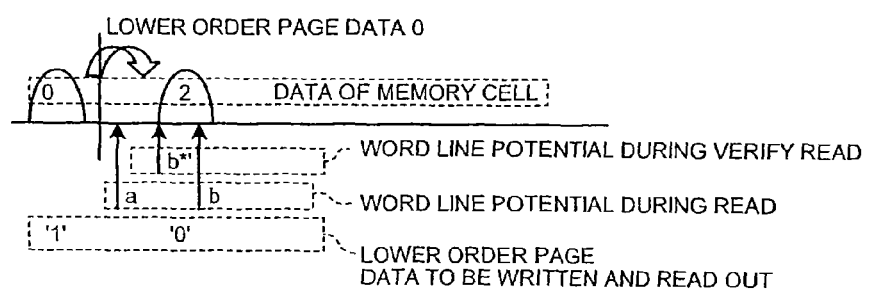
FIGS. 15A to 15D are diagrams of examples of a relation between data in a memory cell and a threshold voltage of the memory cell and order of writing in a NAND memory.
Figure 15B:
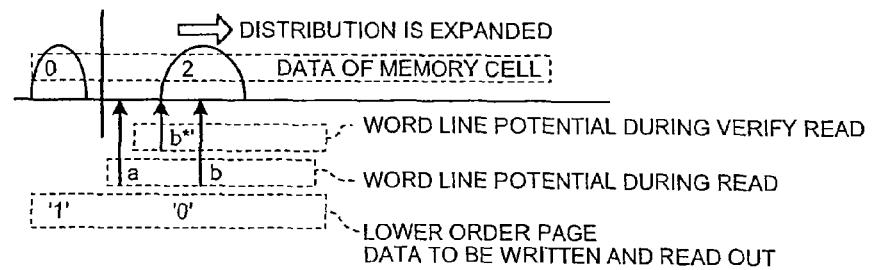
Figure 15C:
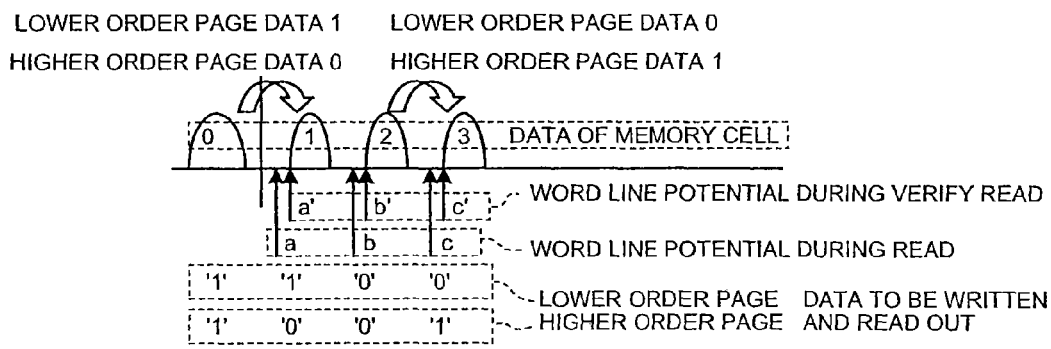

FIGS. 15A to 15D are diagrams of examples of a relation between data in a memory cell and a threshold voltage of the memory cell and order of writing in the NAND memory. First, the data in the memory cell is set to "0" when an erasing operation is performed. Subsequently, as shown in FIG. 15A, when writing in a lower order page is performed, the data in the memory cell changes to data "0" and data "2". As shown in FIG. 15B, before writing in a higher order page, data equal to or lower than a threshold voltage of actual data is written in an adjacent cell. Then, a distribution of a threshold voltage of the data "2" is expanded by the data written in the cell. Thereafter, when data of the higher order page is written, the data in the memory cell changes to data "0" to "3" having an original threshold voltage as shown in FIG. 15C. In the first embodiment, the data in the memory cell is defined from low to high threshold voltages.

Figure 15D:
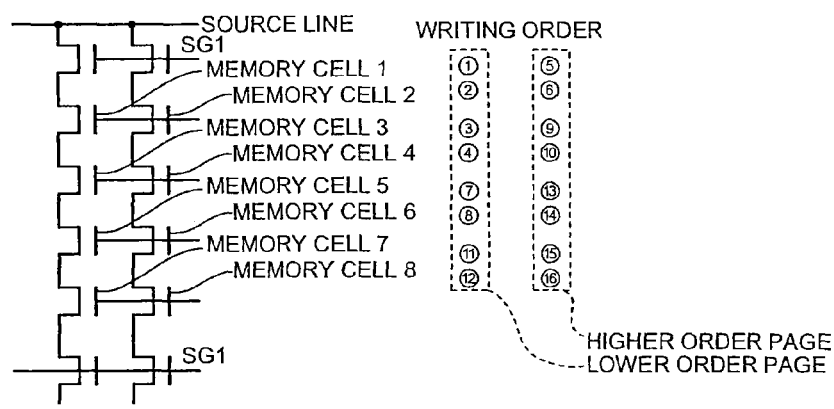

Writing processing in the NAND memory 12 is explained. As shown in FIG. 15D, a writing operation is performed for each of pages from a memory cell close to a source line in a block. In FIG. 15D, for convenience of explanation, four word lines are shown.

In first writing (indicated by encircled 1), 1-bit data is written in a lower order page of a memory cell 1. In second writing (indicated by encircled 2), 1-bit data is written in a lower order page of a memory cell 2 adjacent to the memory cell 1 in a word direction. In third writing (indicated by encircled 3), 1-bit data is written in a lower order page of a memory cell 3 adjacent to the memory cell 1 in a bit direction. In fourth writing (indicated by encircled 4), 1-bit data is written in a lower order page of a memory cell 4 diagonally adjacent to the memory cell 1.

In fifth writing (indicated by encircled 5), 1-bit data is written in a higher order page of the memory cell 1. In sixth writing (indicated by encircled 6), 1-bit data is written in a higher order page of the memory cell 2 adjacent to the memory cell 1 in the word direction. In seventh writing (indicated by encircled 7), 1-bit data is written in a lower order page of a memory cell 5 adjacent to the memory cell 3 in the bit direction. In eighth writing (indicated by encircled 8), 1-bit data is written in a lower order page of a memory cell 6 diagonally adjacent to the memory cell 3.

In ninth writing (indicated by encircled 9), 1-bit data is written in a higher order page of the memory cell 3. In tenth writing (indicated by encircled 10), 1-bit data is written in a higher order page of the memory cell 4 adjacent to the memory cell 3 in the word direction. In eleventh writing (indicated by encircled 11), 1-bit data is written in a lower order page of a memory cell 7 adjacent to the memory cell 5 in the bit direction. In the twelfth writing (indicated by encircled 12), 1-bit data is written in a lower order page of a memory cell 8 diagonally adjacent to the memory cell 5.

In thirteenth writing (indicated by encircled 13), 1-bit data is written in a higher order page of the memory cell 5. In fourteenth writing (indicated by encircled 14), 1-bit data is written in a higher order page of the memory cell 6 adjacent to the memory cell 5 in the word direction. In fifteenth writing (indicated by encircled 15), 1-bit data is written in a higher order page of the memory cell 7. In sixteenth writing (indicated by encircled 16), 1-bit data is written in a higher order page of the memory cell 8 adjacent to the memory cell 7 in the word direction.

A specific example of a selection method for logs used for restoration of management information is explained. FIGS. 16A to 17G are diagrams for explaining the selection method for logs used for restoration of management information. In FIGS. 16A to 17G, a pre-log and a post-log are stored for each of pages in the block for a pre-log (a block on the left side of each of the figures) and the block for a post-log (a block on the right side of each of the figures). A page in one physical block in FIGS. 16A to 17G corresponds to FIGS. 15A to 15D. In other words, pages 1 to 4, 7 to 8, and 11 to 12 are the lower order page shown in FIGS. 15A to 15D. Pages 5 to 6, 9 to 10, and 13 to 16 are the higher order page shown in FIGS. 15A to 15D. In the block for a pre-log and the block for a post-log, each of the rows in the blocks corresponds to one page. In FIGS. 16A to 17G, the pages are separated into lower order pages and higher order pages for convenience of explanation. A combination of the lower order pages and the higher order pages form one physical block.

In FIGS. 16A to 17G, a normally-stored log is indicated by a log x1, a log broken because of a short break is indicated by a log y1, and a log that is currently being written is indicated by a log z1. Because a short break has occurred during writing of the log z1 and the log y1 is broken, a memory cell corresponding to a page of the log z1 and a memory cell corresponding to a page of the log y1 are the same. The page of the log y1 is a page on a lower order side (a lower order page) and the page of the log z1 is a page on a higher order side (a higher order page). Among logs (pages) of each of the blocks, encircled logs are logs selected as logs used for restoration of management information.

Figure 16A:
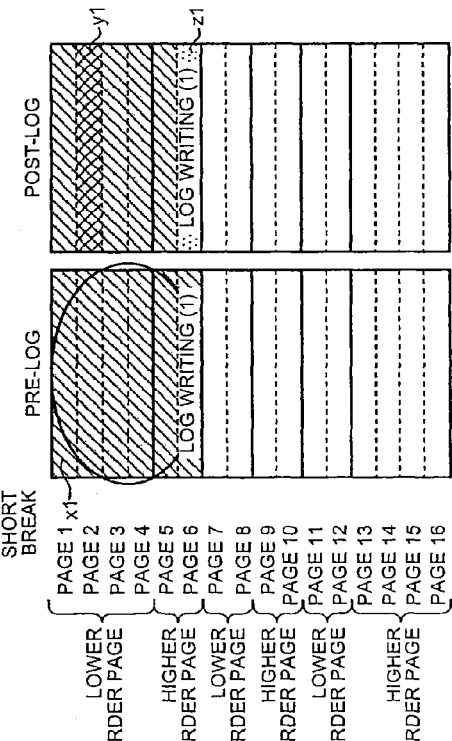
FIGS. 16A to 16D are diagrams (1) for explaining a selection method for logs used for restoration of management information.

FIG. 16A is a diagram of the pre-log and the post-log at normal time (when abnormal isolation of the power supply does not occur and the power supply is turned off). FIGS. 16B to 16D and FIGS. 17E to 17G are diagrams of the pre-log and the post-log at the time when short break occurs.

In FIG. 16A, the pre-log and the post-log stored in the NAND memory 12 when the power supply of the memory system 10 is turned off without storing the snapshot 210 are shown. In the case of FIG. 16A, because data is written in only the lower order pages (pages 1 to 4), even if a short break occurs during writing in the lower order pages, lower order page data breakage does not occur. As shown in FIG. 16A, in the first embodiment, the pre-log and the post-log are stored in the same page of the different blocks. Therefore, when the power supply is turned off at the normal time, the last page of the pre-log and the last page of the post-log are in the same page position. Therefore, in this case, the management information is restored by using the pre-log. At the normal time shown in FIG. 16A, the management information can be restored by using the post-log instead of the pre-log.

Figure 16B:
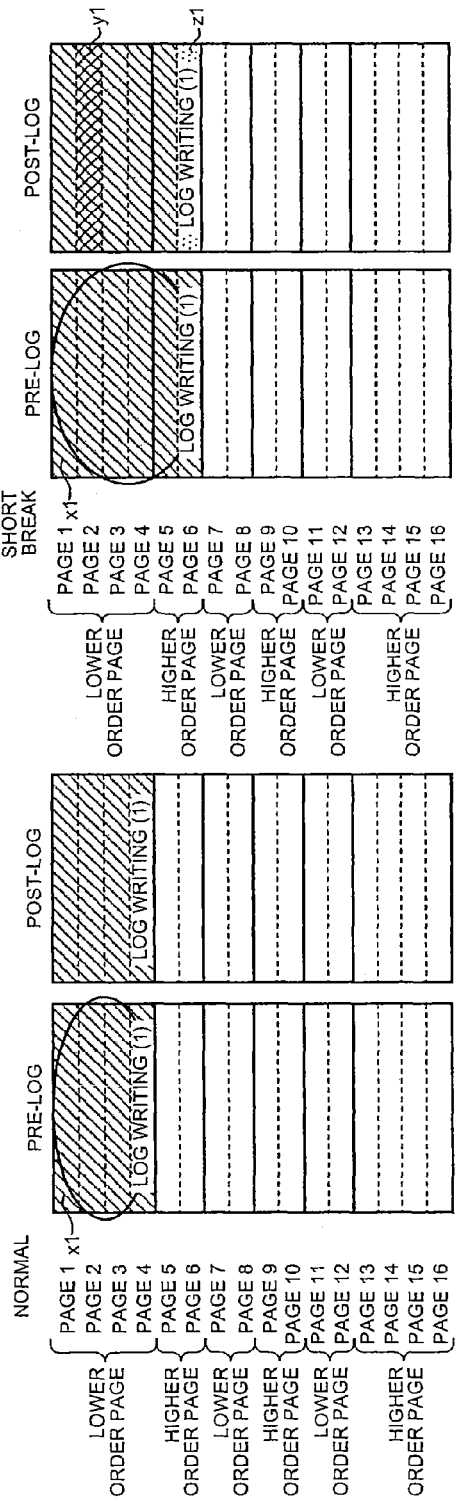

In FIG. 16B, a short break occurs while "log writing (1)" is performed as the pre-log. As shown in FIG. 16B, when the short break occurs during writing in the higher order page (page 6) of the pre-log, lower order page data breakage occurs in the lower order page (page 2 of the pre-log) corresponding to the higher order page being written. In other words, in the case of FIG. 16B, because the short break occurs during storage of the pre-log, the log y1 is generated in the block on the pre-log side. In this case, the log z1 (the log that is currently being stored) corresponding to "log writing (1)" is stored in the block on the pre-log side. On the other hand, the post-log corresponding to "log writing (1)" is not stored in the block on the post-log side. Therefore, the last page of the pre-log and the last page of the post-log contain different information. In this case, the management information is restored by using the post-log.

Figure 16C:
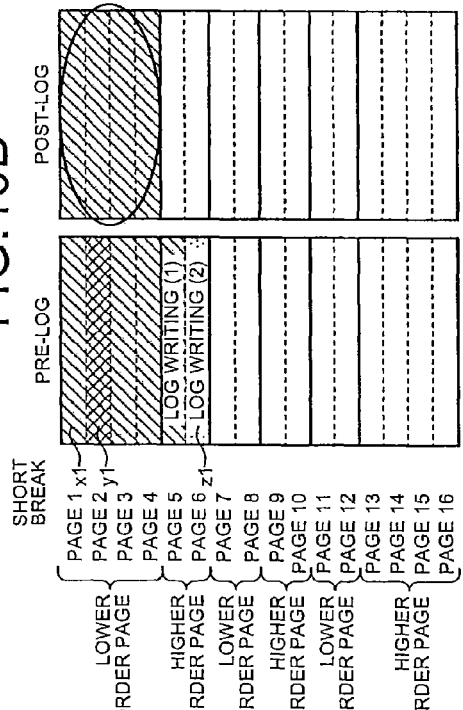

In FIG. 16C, a short break occurs while "log writing (1)" is performed as the post-log. As shown in FIG. 16C, when the short break occurs during writing in the higher order page (page 6) of the post-log, lower order page data breakage occurs in the lower order page (page 2 of the post-log) corresponding to the higher order page being written. In other words, in the case of FIG. 16C, because the short break occurs during storage of the post-log, the log y1 is generated in the block on the post-log side. In this case, the log z1 corresponding to "log writing (1)" is stored in the block on the post-log side. The pre-log corresponding to "log writing (1)" is already stored in the block on the pre-log side. Therefore, the last page of the pre-log and the last page of the post-log are the same. In this case, the management information is restored by using the pre-log.

Figure 16D:
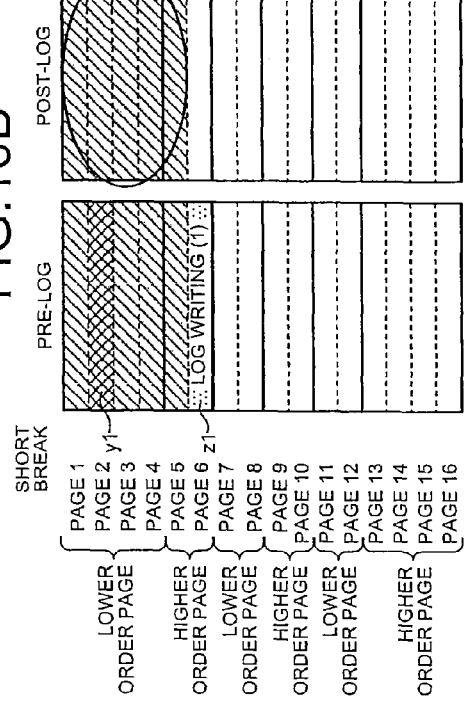

In FIG. 16D, after "log writing (1)" is performed as the pre-log, an error occurs during data writing corresponding to the pre-log. A short break occurs while "log writing (2)" is performed as the pre-log corresponding to rewriting processing of data writing. As shown in FIG. 16D, when the short break occurs during writing in the higher order page (page 6) of the pre-log, lower order page data breakage occurs in the lower order page (page 2 of the pre-log) corresponding to the higher order page being written. In other words, in the case of FIG. 16D, because the short break occurs during storage of the pre-log, the log y1 occurs in the block on the pre-log side. In this case, the log x1 corresponding to "log writing (1)" and the log z1 corresponding to "log writing (2)" are stored in the block on the pre-log side. On the other hand, the post-log corresponding to "log writing (1)" and the post-log corresponding to "log writing (2)" are not stored in the block on the post-log side. Therefore, the last page of the pre-log and the last page of the post-log are different. In this case, the management information is restored by using the post-log.

In FIG. 17E, after "log writing (1)" is performed as the pre-log, an error occurs during data writing corresponding to the pre-log and "log writing (2)" is performed as the pre-log corresponding to rewriting processing of data writing. Further, in FIG. 17E, after "log writing (2)" is performed as the post-log corresponding to rewriting processing of data writing, a short break occurs while "log writing (1)" is performed as the post-log corresponding to first data writing. As shown in FIG. 17E, when the short break occurs during writing in the higher order page (page 6) of the post-log, lower order page data breakage occurs in the lower order page (page 2 of the post-log) corresponding to the higher order page being written. In other words, in the case of FIG. 17E, because the short break occurs during storage of the post-log, the log y1 is generated in the block on the post-log side. In this case, the log x1 corresponding to "log writing (1)" and the log x1 corresponding to "log writing (2)" are stored in the block on the pre-log side. On the other hand, the log x1 corresponding to "log writing (2)" and the log z1 corresponding to "log writing (1)" are stored in the block on the post-log side. Therefore, the last page of the pre-log and the last page of the post-log are the same. The management information is restored by using the pre-log.

In FIG. 17F, a short break occurs while "log writing (1)" over two pages is performed as the pre-log. As shown in FIG. 17F, when the short break occurs during writing in the higher order pages (page 5 and page 6) of the pre-log, lower order page data breakage occurs in the lower order pages (page 1 and page 2 of the post-log) corresponding to the higher order pages being written. In other words, in the case of FIG. 17E, because the short break occurs during storage of the pre-log, the log y1 (e.g., page 2) is generated in the block on the pre-log side. In this case, the log x1 (a pre-stage page) and the log z1 (a post-stage page) corresponding to "log writing (1)" are stored in the block on the pre-log side. On the other hand, the post-log corresponding to "log writing (1)" is not stored in the block on the post-log side. Therefore, the last page of the pre-log and the last page of the post-log are different. The management information is restored by using the post-log.

In FIG. 17G, a short break occurs while "log writing (1)" over two pages is performed as the post-log. As shown in FIG. 17G, when the short break occurs during writing in the higher order pages (page 6 and page 7) of the post-log, lower order page data breakage occurs in the lower order pages (page 1 and page 2 of the post-log) corresponding to the higher order pages being written. In other words, in the case of FIG. 17G, because short break has occurred during storage of the post-log, the log y1 (e.g., page 2) is generated in the block on the post-log side. In this case, the log x1 and the log z1 corresponding to "log writing (1)" are stored in the block on the post-log side. The post-log corresponding to "log writing (1)" is already stored over two pages in the block on the pre-log side. Therefore, the last page of the pre-log and the last page of the post-log are the same. The management information is restored by using the pre-log.

In the first embodiment, when the memory system 10 is reset after abnormal isolation of the power supply or the like, the management-information restoring unit 155 takes a snapshot again and stores the snapshot at a stage when the restoration of the management information and the recovery processing are finished. Consequently, because the past log is opened, a log broken by the influence of short break or the like does not remain. It is possible to improve reliability of the memory system 10.

Second Embodiment

Figure 18:
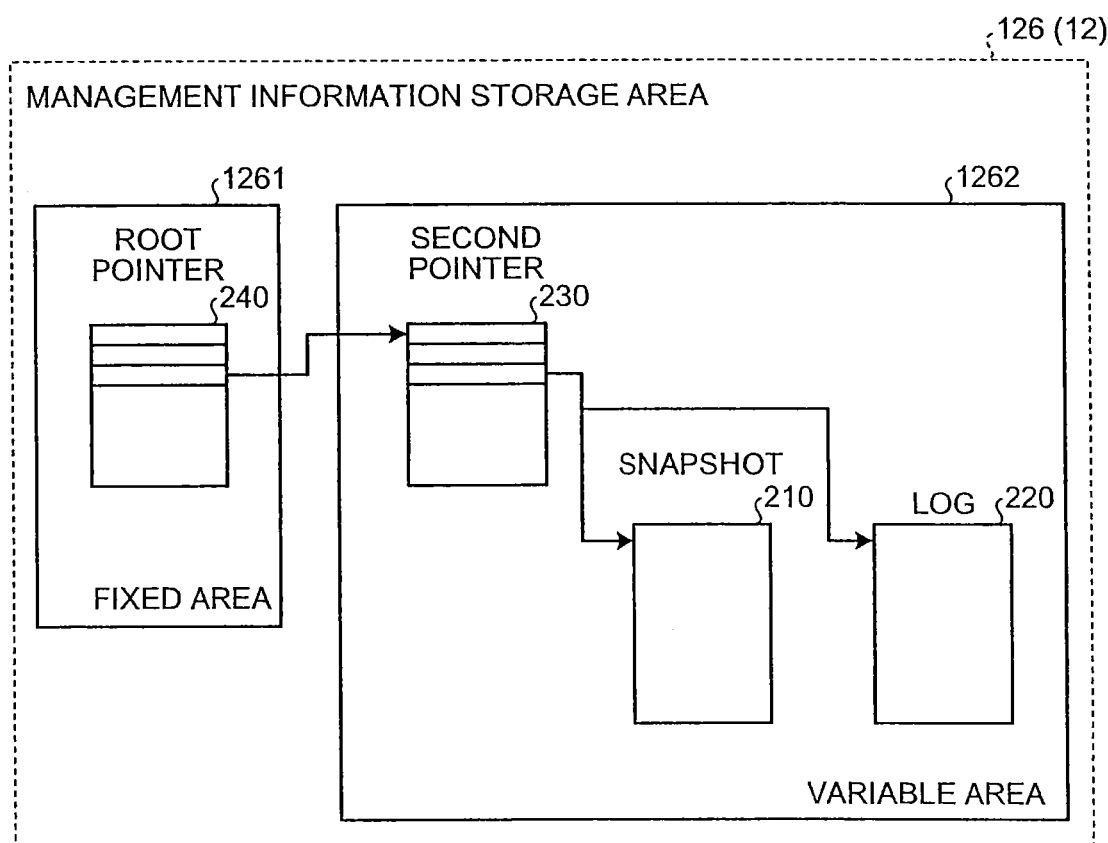
FIG. 18 is a schematic diagram of another example of contents of the management information storage information stored in the management information storage area.

FIG. 18 is a schematic diagram of an example of contents of management information storage information stored in the management information storage area 126. The management information storage information stored in the management information storage area 126 includes the snapshot 210 as contents of the nonvolatile table at a certain point, the log 220 as update difference information of the contents of the nonvolatile table until a snapshot is taken next time, the second pointer 230 indicating the snapshot 210 and a position (a block) of the log 220 acquired first concerning this snapshot 210, and the root pointer 240 indicating a position (a block) where the root pointer 240 is stored. The snapshot 210 is information obtained by storing management information including at least the nonvolatile table at a predetermined point among the kinds of management information stored in the temporary storage area 111 of the DRAM 11.

The snapshot 210, the log 220, the second pointer 230, and the root pointer 240 are stored in different blocks, respectively. The size of the blocks is the same as the size of a physical block as an erasing unit. The snapshot 210 is stored in a snapshot storing block. The snapshot 210 includes the logical NAND management information 42 and the intra-NAND logical-physical conversion information 43 as nonvolatile tables in the management information storage area 126 of the NAND memory 12. When a new snapshot 210 is stored, the snapshot 210 is stored in a block different from that of the snapshot 210 stored before.

The log 220 is stored in a log storing block. When contents of the nonvolatile table are changed, the log 220 is difference information between the nonvolatile table after the contents are changed and the snapshot 210 (when a log is generated first after acquisition of the snapshot 210) or difference information between the nonvolatile table after the contents are changed and the snapshot 210. The log 220 is written in the log storing block in page units in a write-once manner every time the log 220 is acquired as difference information. FIG. 9 depicts an example of the log 220. The log 220 includes target information to be management information of a change target, a target entry as an entry to be a change target in the target information, a target item as an item to be a change target in the target entry, and change contents as content of a change of the target item. The log 220 is reformed according to storage of the new snapshot 210 because the log 220 is update difference information for the snapshot 210. In the second embodiment, the pre-log and the post-log are described as "log" without distinction. The same can apply when the pre-log and the post-log are acquired as in the first embodiment.

The second pointer 230 is stored in a second pointer storing block. The second pointer 230 only has to be a pointer that indicates top addresses of blocks indicating storage positions of the snapshot 210 and the log 220. The second pointer 230 is updated when the snapshot 210 is stored anew or when the snapshot storing block and the log storing block are changed.

The second pointer 230 includes snapshot access information for accessing the snapshot storing block, log access information for accessing the log storing block, and a next pointer indicating a page position where the next second pointer is stored. The second pointer 230 is changed to information in a linked list system by this next pointer. It is possible to reach the latest second pointer 230 by tracking the next pointer from the top page of the second pointer storing block designated by the root pointer 240. Instead of the linked list system, the second pointer 230 can be stored in a write-once manner in order from the top page of the second pointer storage area. A pointer indicating a top address of the log 220 can be stored in the snapshot 210. The second pointer 230 can include only a pointer indicating a top address of the snapshot 210.

The root pointer 240 is stored in a root pointer storing block. The root pointer 240 is information for accessing the second pointer storing block in which the second pointer 230 as the first pointer is stored and is information read first in processing for restoring the management information when the memory system 10 is started. The first root pointer 240 is changed when the second pointer storing block is changed. The root pointer 240 is stored in the root pointer storing block, for example, in a write-once manner in order from a top page of the block. In such a case, a page immediately preceding an unwritten page in the root pointer storing block has latest information. Therefore, it is possible to retrieve the latest first root pointer 240 by retrieving a highest order page of the unwritten page. As in the case of the second pointer 230, it is also possible to use a linked list.

The root pointer 240 is stored in the fixed area 1261 in the NAND memory 12. The snapshot 210, the log 220, and the second pointer 230 are stored in the variable area 1262 in the NAND memory 12. The fixed area 1261 is a protected area in which a relation between a logical block managed by the logical NAND management layer 32 and a physical block managed by the physical NAND management layer 33 is fixed in the NAND memory 12 and is an area in which information necessary for running the memory system 10 having a low update frequency in which rewriting and writing hardly occurs is stored.

On the other hand, the variable area 1262 is an area in which the relation between the logical block managed by the logical NAND management layer 32 and the physical block managed by the physical NAND management layer 33 is variable in an area of the NAND memory 12 excluding the fixed area 1261. The variable area 1262 is an area as a target of wear leveling.

Functions of the drive control unit 14, a functional configuration of the data managing unit 141, and the like are the same as those in the first embodiment (see FIGS. 10 and 11). The management-information managing unit 152 includes the management-information writing unit 153 and the management-information storing unit 154. The management-information writing unit 153 performs update of the management information stored in the DRAM 11 when update of the management information is necessary according to the change processing for data stored in the DRAM 11 or the NAND memory 12 by the data-transfer processing unit 151.

When the memory system 10 satisfies a predetermined condition, the management-information storing unit 154 stores, in the management information storage area 126 of the NAND memory 12, the management information as the snapshot 210 and information to be updated in the management information as the log 220. The management-information storing unit 154 also performs pointer update processing that is required according to the storage of the snapshot 210 or the log 220.

Storing of the snapshot 210 is performed by the management-information storing unit 154, for example, when any one of the following snapshot storage conditions explained as examples below is satisfied:

(1) Standby (an instruction for minimizing power consumption of a main body of the memory system 10), sleep (an instruction for stopping a device when there is no access during a predetermined time), or reset (an instruction for restarting the memory system 10) signal is received, and (2) The log storage area provided for storing the log 220 in the management information storage area 126 of the NAND memory 12 becomes full with data, Timing when the management-information storing unit 154 stores the log 220 is the time when update of the management information (the nonvolatile table) stored in the DRAM 11 is performed by the management-information writing unit 153 (when data writing in the NAND memory 12 is necessary).

When the power supply of the memory system 10 is turned on, the management-information restoring unit 155 performs restoration processing for management information based on the management information storage information stored in the management information storage area 126 of the NAND memory 12. Specifically, the management-information restoring unit 155 traces the root pointer 240, the second pointer 230, the snapshot 210, and the log 220 in order and determines whether the log 220 corresponding to the latest snapshot 210 is present. When the log 220 is not present, the management-information restoring unit 155 restores, in the DRAM 11, the snapshot 210 of the snapshot storing block as management information. When the log 220 is present, the management-information restoring unit 155 acquires the snapshot 210 from the snapshot storing block, acquires the log 220 from the log storing block, and performs restoration of the management information (the nonvolatile table) reflecting the log 220 on the snapshot 210 on the DRAM 11. At this point, because it is likely that the memory system 10 does not end normally but ends abnormally because of short break or the like, the management-information restoring unit 155 appropriately performs restoration of the management information including determination of the end of the memory system 10.

As explained in (1) of the snapshot storage conditions, the memory system 10 can be set to store the snapshot 210 using the management-information storing unit 154 when the memory system 10 receives the standby, sleep, or reset signal. In other words, the memory system 10 can be set to take the snapshot 210 again every time the memory system 10 receives the standby, sleep, or reset signal and thereafter shifts to a designated state (a standby, sleep, or reset state). When the memory system 10 is set in this way, it is possible to restore the management information based on only the snapshot 210 during restart and it is unnecessary to refer to the log 220. Therefore, it is possible to reduce start time.

On the other hand, if the snapshot 210 is taken again every time the standby, sleep, or reset signal is received, for example, when the standby signal or the like is received immediately after the snapshot 210 is stored at a certain point, a situation in which the log length (size) of the log 220 stored during the signal reception is sufficiently short occurs. In such a case, regardless of the fact that there is only a small change from the snapshot 210 stored before the reception of the standby signal or the like, the snapshot 210 is taken again. Therefore, writing of the snapshot 210 is performed regardless of the fact that contents are updated only a little and writing efficiency falls. Because the snapshot 210 is content of the nonvolatile table, the size of the snapshot 210 is large. Therefore, writing of the snapshot 210 takes time and it takes long to shift to a designated state. Whereas the size of the snapshot is, for example, 8 MB, the size of a log acquired as difference information is a page size (4 KB).

Further, if the snapshot 210 is always taken again every time the standby, sleep, or reset signal is received, deterioration in the NAND memory 12 worsens because of erasing of a block performed prior to writing. In this way, in the memory system 10 employing the NAND memory 12, because the snapshot 210 is taken again every time the standby signal or the like is received, there is a problem due to the characteristic of the NAND memory 12 that the durable life of the memory system 10 is reduced in addition to the characteristic that waiting time until shifting to a designated state is long.

Therefore, in the second embodiment, when the standby, sleep, or reset signal is received, it is possible to select to take the snapshot 210 again and shift to a designated state or to shift to the designated state without taking the snapshot 210 again. Specifically, the management-information storing unit 154 receives the standby signal or the like and performs switching to any one of the types of the shift according to, for example, whether the log 220 is stored in the management information storage area 126 and, when the log 220 is stored, according to the log length (size) of the log 220.

Figure 19A:
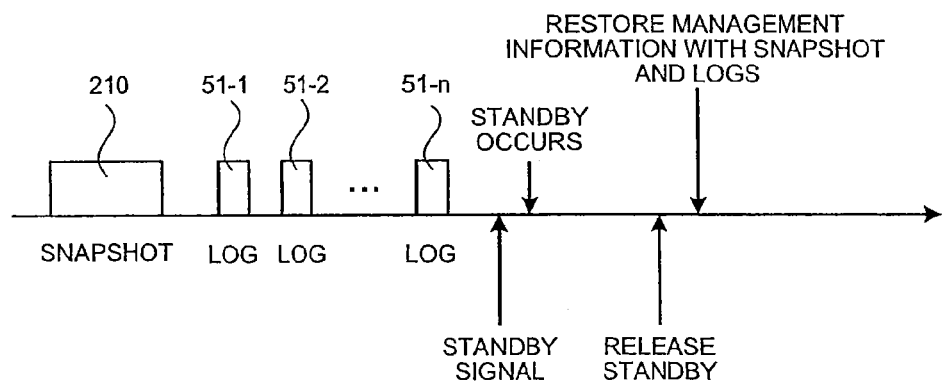
FIGS. 19A and 19B are timecharts of shifting to a standby state without taking a snapshot again and shifting to the standby state after taking the snapshot again when a standby signal is received.
Figure 19B:
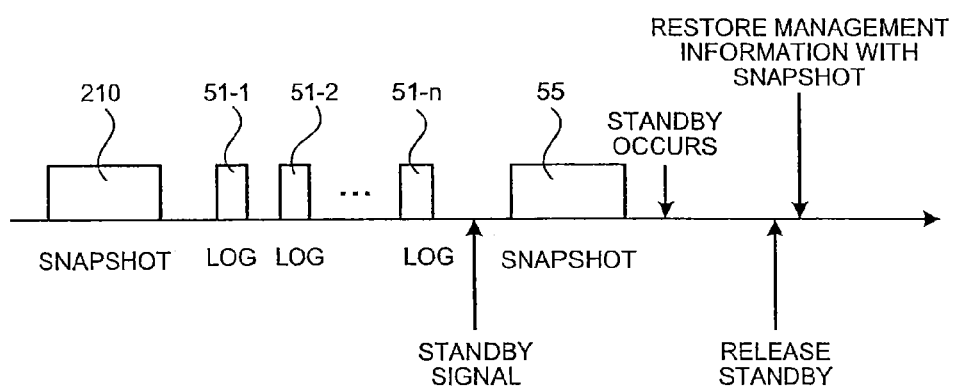

FIG. 19A is a timechart of shifting to a standby state without taking a snapshot again and FIG. 19B is a timechart of shifting to the standby state after taking the snapshot again when a standby signal is received. In FIGS. 19A and 19B, the standby signal is shown as an example. However, the same applies in the sleep and reset signals.

Figure 20:
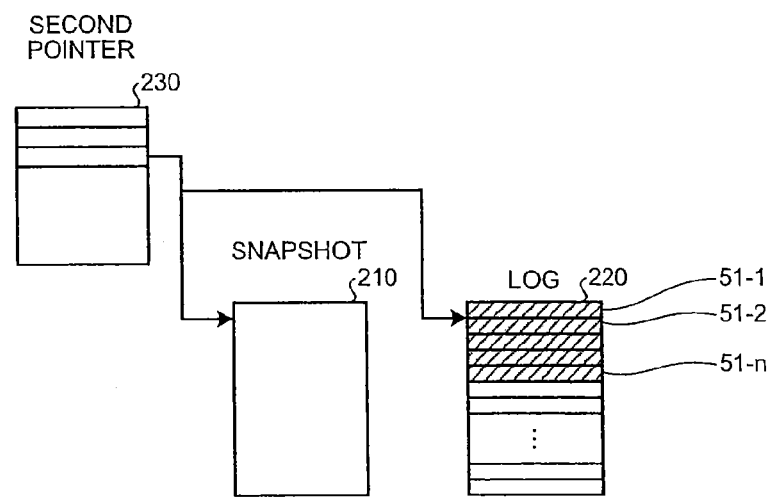
FIG. 20 is a diagram of a state in which a log is stored in page units in a log storing block.

In a situation shown in FIG. 19A, because the condition (2) of the snapshot storage conditions is satisfied, the snapshot 210 is acquired and, subsequently, logs 51-1 to 51-$n$, where "n" is an integer equal to or larger than 1, are sequentially acquired according to update of contents of the nonvolatile table. The logs 51-1 to 51-$n$ are sequentially written in the log storing block in a write-once manner in page units and stored as the log 220. FIG. 20 is a diagram of a state in which logs are stored in page units in the log storing block. In FIG. 20, among the components shown in FIG. 18, only the second pointer 230, the snapshot 210, and the log 220 are shown for the sake of simplicity. The log 220 includes the logs 51-1 to 51-$n$ sequentially written in a write-once manner from a top page to an n page in the log storing block.

Further, following the storage of the log 51-$n$, although the standby signal is generated, the management-information storing unit 154 shifts to the standby state without taking a snapshot again (standby occurs). When the standby is released, the memory system 10 starts from the standby state. The management-information restoring unit 155 acquires the snapshot 210 from the snapshot storing block of the management information storage area 126, acquires the log 220 from the log storing block of the management information storage area 126, and restores the management information (the nonvolatile table) reflecting the log 220 on the snapshot 210 on the DRAM 11.

In FIG. 19B, the storage of the snapshot 210 and the logs 51-1 to 51-$n$ and the generation of the standby signal are the same as those shown in FIG. 19A. However, the management-information storing unit 154 takes a snapshot 55 again after the generation of the standby signal. When the snapshot 55 is stored, the second pointer 230 is updated. The second pointer 230 indicates a top address of the snapshot 55 and indicates a top address of a log storing block for the snapshot 55 secured anew. When the management-information storing unit 154 takes the snapshot 55 again, the management-information storing unit 154 immediately shifts to the standby state (standby occurs). Therefore, a log is not stored in the log storing block for the snapshot 55. When the standby is released, the memory system 10 starts from the standby state. The management-information restoring unit 155 acquires the snapshot 55 from the snapshot storing block of the management information storage area 126 and restores the management information (the nonvolatile table) based on the snapshot 55 on the DRAM 11.

In the second embodiment, the management-information storing unit 154 performs the switching according to, for example, the log length (size) of the log 220 stored in the management information storage area 126. When the log length (size) is equal to or larger than a predetermined size, the management-information storing unit 154 takes a snapshot again (FIG. 19B). When the log length (size) is smaller than the predetermined size, the management-information storing unit 154 does not take a snapshot again (FIG. 19A). In FIGS. 19A, 19B, and 20, the log length (size) of the log 220 is a total of the sizes of the logs 51-1 to 51-$n$ and is a size for n pages. Therefore, the management-information storing unit 154 can perform switching to take a snapshot again and to not take a snapshot again by comparing n and the number of switching reference pages (nth).

The number of switching reference pages nth can be determined, for example, with the method explained below. In FIG. 19A, because a snapshot is not taken again after the generation of the standby signal, shifting time to the standby state is short. On the other hand, during restoration of the management information after the release of the standby, it is necessary to read out the logs 51-1 to 51-$n$ in addition to the snapshot 210. When n is larger, longer time is required for restoration. Conversely, when n is sufficiently small, a difference between time for restoring the management information based on the snapshot 210 and the logs 51-1 to 51-$n$ and time for restoring the management information based on the snapshot 55 (FIG. 19B) is small. Therefore, the selection of the case shown in FIG. 19A is advantageous when n is smaller.

In general, start time of the memory system 10 depends on the specification of the system. Therefore, when restoration takes time and start time exceeds the specification of the system because n is large, the case shown in FIG. 19A cannot be selected. In other words, the number of switching reference pages nth is a value with which start time in the case shown in FIG. 19A satisfies the specification of the system when n is smaller than this value.

In FIG. 19B the snapshot 55 is taken again after the generation of the standby signal. Therefore, because of the writing time for the snapshot 55, in addition to the fact that the shifting time to the standby state is long, writing efficiency falls when n is small. Therefore, it can be said that the selection of the case shown in FIG. 19B is advantageous when n is larger. Therefore, taking into account the case shown in FIG. 19A as well, it is preferable to select the case shown in FIG. 19B when n is equal to or larger than the number of switching reference pages nth.

Figure 21:
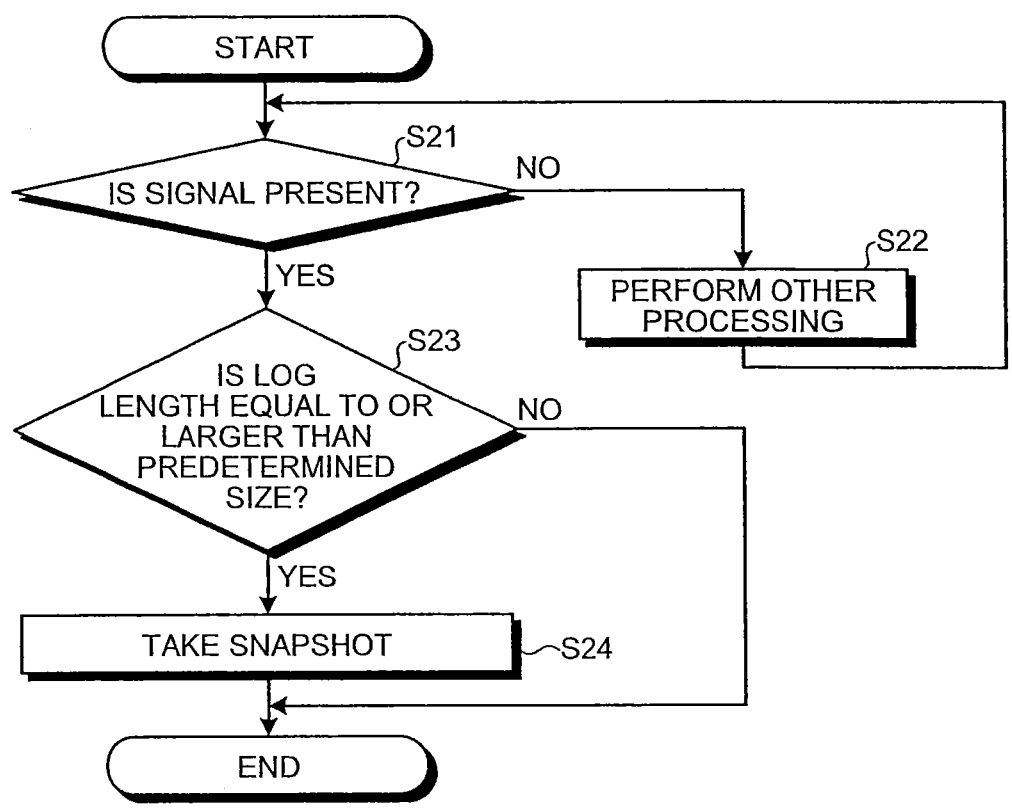
FIG. 21 is a flowchart for explaining operations of a management-information storing unit illustrated in FIG. 11 during standby, sleep, or reset.

FIG. 21 is a flowchart for explaining operations of the management-information storing unit 154 during standby, sleep, or reset.

The management-information storing unit 154 determines presence or absence of any of a standby, sleep, or reset signal (Step S21). When there is no input of the standby, sleep, or reset signal (No at Step S21), the management-information storing unit 154 performs other processing (Step S22) and returns to Step S21. When it is determined at Step S21 that any of the standby, sleep, or reset signal is input (Yes at Step S21), the management-information storing unit 154 determines whether the log length is equal to or larger than the predetermined size (Step S23). When it is determined that the log length is equal to or larger than the predetermined size (Yes at Step S23), the management-information storing unit 154 takes a new snapshot (Step S14) and finishes the processing. When it is determined that the log length is smaller than the predetermined size (No at Step S23), the management-information storing unit 154 finishes the processing without taking a new snapshot. Thereafter, the memory system 10 changes to a state corresponding to the standby, sleep, or reset signal.

According to the second embodiment, when the standby, sleep, or reset signal is received, the management-information storing unit 154 determines whether the log length is equal to or larger than the predetermined size and determines to take a snapshot again and shift to a designated state or to shift to the designated state without taking a snapshot again. Therefore, because it is unnecessary to take a snapshot again every time the standby, sleep, or reset signal is received, it is possible to reduce the number of times of writing in the NAND memory 12 and suppress the durable life of the NAND memory 12 from being reduced. There is also an effect that it is possible to reduce time for restoration of the management information by the management-information restoring unit 155.

In the above explanation, the data management unit in the DRAM 11 is the page size unit, the data writing and readout unit in the NAND memory 12 is the page size unit, and the erasing unit and the management unit are the block size unit. However, this does not mean that the data management unit, the data writing and readout unit, and the erasing unit and the management unit are limited to these size units. Arbitrary units can be used as the data management unit, the data writing and readout unit, and the erasing unit and the management unit.

The charge accumulating layer is not limited to the floating gate type and can be a charge trap type including a silicon nitride film such as the MONOS (Metal-Oxide-Nitride-Oxide-Semiconductor) structure and other systems.

As explained above, according to the present invention, there is an effect that it is possible to eliminate likelihood that a log is broken after reset from abnormal isolation of a power supply and improve reliability of management information.

According to the present invention, when the standby, sleep, or reset signal is received, it is possible to shift to a designated state without taking a snapshot again and thereafter return to a state before the shift. Therefore, there is an effect that it is unnecessary to take a snapshot every time the standby, sleep, or reset signal is received and it is possible to reduce the number of times of writing in a memory cell in which multi-value data can be stored and suppress the durable life of the memory cell from being reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A memory system storing management information comprising:
   a nonvolatile memory;
   a volatile memory configured to store at least one part of first management information stored in the nonvolatile memory; and
   a memory controller configured to perform data management in the nonvolatile memory based on the first management information stored in the volatile memory,
   wherein the memory controller includes:
   a management-information storing unit configured to store a log indicating difference information before and after updating the first management information in the nonvolatile memory, the log including a first log being created before updating the first management information and a second log being created after updating the first management information, and to store the first management information in the nonvolatile memory as second management information; and
   a management-information storing unit configured to store the first management information on the volatile memory based on at least one of the second management information and the log stored in the nonvolatile memory, wherein
   when an error has occurred in the memory system, the management-information storing unit is configured to store the first management information as third management information in the nonvolatile memory.

2. The memory system according to claim 1, wherein the management-information storing unit is configured to invalidate the log after storing the third management information in the nonvolatile memory.

3. The memory system according to claim 1, wherein the management-information storing unit is configured to store, when the error has occurred in the memory system, the first management information on the volatile memory based on the second management information and the log which is not corrupted by the error.

4. The memory system according to claim 1, wherein
   the nonvolatile memory includes a plurality of blocks, each one of the plurality of blocks being a data erasing unit and including a plurality of pages, each one of the plurality of pages being a data programming unit, and
   the management-information storing unit is configured to store the log by a page unit in each one of the plurality of blocks.

5. The memory system according to claim 1, wherein the first log and the second log have same contents as each other.

6. The memory system according to claim 1, wherein the error includes a program error in the nonvolatile memory.

7. The memory system according to claim 1, wherein the error includes an abnormal power down of the memory system.

8. The memory system according to claim 1, wherein the volatile memory is a DRAM.

9. The memory system according to claim 1, wherein the nonvolatile memory is a NAND flash memory.

10. A method of controlling a memory system comprising:
    storing data in a nonvolatile memory;
    storing at least one part of first management information in a volatile memory;
    performing data management in the nonvolatile memory based on the first management information;
    storing a log indicating difference information before and after updating the first management information, the log including a first log being created before updating the first management information and a second log being created after updating the first management information;
    storing the first management information in the nonvolatile memory as a snapshot second management information;
    storing the first management information based on at least one of the second management information and the log stored in the nonvolatile memory; and
    in a case of having an error in the memory system, storing the first management information as third management information.

11. The method according to claim 10, further comprising:
    invalidating the log after storing the third management information in the nonvolatile memory.

12. The method according to claim 10, wherein the storing includes storing, when the error has occurred in the memory system, the first management information on the volatile memory based on the second management information and the log which is not corrupted by the error.

13. The method according to claim 10, wherein
    the nonvolatile memory includes a plurality of blocks, each one of the plurality of blocks being a data erasing unit and including a plurality of pages, each one of the plurality of pages being a data programming unit, and further comprising:
    storing the log by a page unit in each one of the plurality of blocks.

14. The method according to claim 10, wherein the first log and the second log have same contents as each other.

15. The method according to claim 10, wherein the error includes a program error in the nonvolatile memory.

16. The method according to claim 10, wherein the error includes an abnormal power down of the memory system.

17. The method according to claim 10, wherein the volatile memory is a DRAM.

18. The method according to claim 10, wherein the nonvolatile memory is a NAND flash memory.

19. A method of controlling a memory system comprising:
    storing data in a nonvolatile memory;
    managing the data by using first management information; and
    storing a first log being created before updating the first management information and a second log being created after updating the first management information;
    storing the first management information in the nonvolatile memory as second management information; and
    in a case of having an error in the memory system, storing the first management information as third management information.

* * * * *